(12) United States Patent
Miyake et al.

(10) Patent No.: US 9,171,640 B2
(45) Date of Patent: Oct. 27, 2015

(54) SHIFT REGISTER AND DISPLAY DEVICE

(75) Inventors: Hiroyuki Miyake, Kanagawa (JP); Seiko Amano, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1044 days.

(21) Appl. No.: 12/897,375

(22) Filed: Oct. 4, 2010

(65) Prior Publication Data

US 2011/0084960 A1 Apr. 14, 2011

(30) Foreign Application Priority Data

Oct. 9, 2009 (JP) .................................. 2009-235109
Dec. 1, 2009 (JP) .................................. 2009-273914

(51) Int. Cl.
G09G 5/00 (2006.01)
G11C 19/28 (2006.01)
G09G 3/32 (2006.01)
G09G 3/36 (2006.01)

(52) U.S. Cl.
CPC .............. G11C 19/28 (2013.01); G09G 3/3266 (2013.01); G09G 3/3677 (2013.01); G09G 2300/0408 (2013.01); G09G 2300/0417 (2013.01); G09G 2310/0267 (2013.01); G09G 2320/0223 (2013.01); G09G 2320/0285 (2013.01)

(58) Field of Classification Search
USPC ........................................................ 345/100
See application file for complete search history.

(56) References Cited

U.S. PATENT DOCUMENTS

| 5,136,622 A | 8/1992 | Plus |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |

(Continued)

FOREIGN PATENT DOCUMENTS

| EP | 1017108 A | 7/2000 |
| EP | 1 737 044 A1 | 12/2006 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Dwayne Bost
*Assistant Examiner* — Robert Michaud
(74) *Attorney, Agent, or Firm* — Fish & Richardson P.C.

(57) ABSTRACT

The shift register includes first to fourth flip-flops. A first clock signal which is in a first voltage state in a first period and in a second voltage state in second to fourth periods is input to the first flip-flop. A second clock signal which is in the first voltage state in the second period and in the second voltage state in the third period and the fourth period is input to the second flip-flop. A third clock signal which is in the second voltage state in the first, second, and fourth periods and in the first voltage state in the third period is input to the third flip-flop. A fourth clock signal which is in the second voltage state in the first and second periods and in the first voltage state in the fourth period is input to the fourth flip-flop.

12 Claims, 28 Drawing Sheets

(56) References Cited

U.S. PATENT DOCUMENTS

| | | |
|---|---|---|
| 6,845,140 B2 | 1/2005 | Moon et al. |
| 6,891,236 B1 | 5/2005 | Yamazaki |
| 6,963,327 B2 | 11/2005 | Kawahata et al. |
| 6,975,142 B2 | 12/2005 | Azami et al. |
| 7,049,190 B2 | 5/2006 | Takeda et al. |
| 7,057,598 B2 | 6/2006 | Azami et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,324,123 B2 | 1/2008 | Yamazaki et al. |
| 7,369,111 B2 | 5/2008 | Jeon et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,443,202 B2 | 10/2008 | Kimura et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,491,655 B2 | 2/2009 | Yamazaki |
| RE40,673 E | 3/2009 | Kanbara et al. |
| 7,501,293 B2 | 3/2009 | Ito et al. |
| 7,511,709 B2 | 3/2009 | Koyama et al. |
| 7,529,334 B2 * | 5/2009 | Jang ............................ 377/64 |
| 7,586,478 B2 | 9/2009 | Azami et al. |
| 7,674,650 B2 | 3/2010 | Akimoto et al. |
| 7,687,808 B2 | 3/2010 | Umezaki |
| 7,696,974 B2 | 4/2010 | Moon et al. |
| 7,710,384 B2 | 5/2010 | Azami et al. |
| 7,732,819 B2 | 6/2010 | Akimoto et al. |
| 7,843,421 B2 | 11/2010 | Chang et al. |
| 7,964,876 B2 | 6/2011 | Umezaki |
| 7,978,274 B2 | 7/2011 | Umezaki et al. |
| 8,031,158 B2 | 10/2011 | Jang et al. |
| 8,040,313 B2 | 10/2011 | Jang |
| 8,054,279 B2 | 11/2011 | Umezaki et al. |
| 8,154,017 B2 | 4/2012 | Yabuta et al. |
| 8,264,445 B2 | 9/2012 | Azami et al. |
| 8,284,142 B2 * | 10/2012 | Yamazaki et al. ............... 345/92 |
| 8,502,222 B2 | 8/2013 | Yabuta et al. |
| 8,513,661 B2 | 8/2013 | Takahashi et al. |
| 8,520,159 B2 | 8/2013 | Umezaki et al. |
| 8,526,567 B2 | 9/2013 | Koyama |
| 8,598,591 B2 | 12/2013 | Umezaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0167026 A1 | 11/2002 | Azami et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0140839 A1 | 7/2004 | Nagao et al. |
| 2005/0017302 A1 | 1/2005 | Hoffman |
| 2005/0062515 A1 | 3/2005 | Nagao et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0202940 A1 | 9/2006 | Azami et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0244391 A1 | 11/2006 | Shishido et al. |
| 2006/0244699 A1 | 11/2006 | Yamazaki |
| 2006/0280279 A1 | 12/2006 | Nagao et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0296660 A1 | 12/2007 | Kimura et al. |
| 2008/0006877 A1 | 1/2008 | Mardilovich et al. |
| 2008/0011861 A1 | 1/2008 | Ikeda et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0062112 A1 | 3/2008 | Umezaki |
| 2008/0073653 A1 | 3/2008 | Iwasaki |
| 2008/0079001 A1 | 4/2008 | Umezaki et al. |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2008/0308806 A1 | 12/2008 | Akimoto et al. |
| 2009/0002590 A1 | 1/2009 | Kimura |
| 2009/0008639 A1 | 1/2009 | Akimoto et al. |
| 2009/0027083 A1 | 1/2009 | Kimura et al. |
| 2009/0068773 A1 | 3/2009 | Lai et al. |
| 2009/0073325 A1 | 3/2009 | Kuwabara et al. |
| 2009/0080593 A1 * | 3/2009 | Kim et al. ....................... 377/75 |
| 2009/0114910 A1 | 5/2009 | Chang |
| 2009/0115792 A1 | 5/2009 | Otose et al. |
| 2009/0121998 A1 | 5/2009 | Ohkawa et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0322716 A1 | 12/2009 | Azami et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0134708 A1 | 6/2010 | Kimura et al. |
| 2010/0136743 A1 | 6/2010 | Akimoto et al. |
| 2010/0158187 A1 | 6/2010 | Moon et al. |
| 2010/0163874 A1 | 7/2010 | Koyama et al. |
| 2011/0085635 A1 | 4/2011 | Koyama |
| 2012/0013585 A1 | 1/2012 | Jang |
| 2012/0049184 A1 | 3/2012 | Umezaki et al. |
| 2012/0056860 A1 | 3/2012 | Umezaki et al. |
| 2013/0057161 A1 | 3/2013 | Azami et al. |

(56) References Cited

U.S. PATENT DOCUMENTS

2013/0341616 A1    12/2013  Umezaki et al.
2013/0341618 A1    12/2013  Koyama

FOREIGN PATENT DOCUMENTS

| EP | 1906414 A | 4/2008 |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-158824 A | 7/1991 |
| JP | 05-251705 A | 9/1993 |
| JP | 08-264794 A | 10/1996 |
| JP | 09-182004 A | 7/1997 |
| JP | 10-261801 A | 9/1998 |
| JP | 11-505377 A | 5/1999 |
| JP | 2000-044236 A | 2/2000 |
| JP | 2000-150900 A | 5/2000 |
| JP | 2000-243974 A | 9/2000 |
| JP | 2000-269513 A | 9/2000 |
| JP | 2001-035180 A | 2/2001 |
| JP | 2002-076356 A | 3/2002 |
| JP | 2002-289859 A | 10/2002 |
| JP | 2002-335153 A | 11/2002 |
| JP | 2003-086000 A | 3/2003 |
| JP | 2003-086808 A | 3/2003 |
| JP | 2004-078172 A | 3/2004 |
| JP | 2004-103957 A | 4/2004 |
| JP | 2004-273614 A | 9/2004 |
| JP | 2004-273732 A | 9/2004 |
| JP | 2006-331633 A | 12/2006 |
| JP | 2007-096055 A | 4/2007 |
| JP | 2007-123861 A | 5/2007 |
| JP | 2008-089874 A | 4/2008 |
| JP | 2008-089915 A | 4/2008 |
| JP | 2008-107807 A | 5/2008 |
| JP | 2008-277326 A | 11/2008 |
| JP | 2009-134845 A | 6/2009 |
| JP | 2009-176865 A | 8/2009 |
| JP | 2011-100532 A | 5/2011 |
| WO | 2004/114391 A1 | 12/2004 |
| WO | 2007-108177 A1 | 9/2007 |
| WO | WO-2008/133220 | 11/2008 |
| WO | WO-2009/093722 | 7/2009 |
| WO | WO-2011/043215 | 4/2011 |
| WO | WO-2011/043451 | 4/2011 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In'Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties, SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Sys-

(56) References Cited

OTHER PUBLICATIONS tems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID 'International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al.. "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn, J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetis in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," Am-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

(56) References Cited

OTHER PUBLICATIONS

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report (PCT Application No. PCT/JP2010/067712) dated Jan. 11, 2011.

Written Opinion of the International Searching Authority (PCT Application No. PCT/JP2010/067712) dated Jan. 11, 2011.

Osada, T et al., "15.2: Development of Driver-Integrated Panel using Amorphous In—Ga—Zn—Oxide TFT," SID Digest '09: SID International Symposium Digest of Technical Papers, May 31, 2009, pp. 184-187.

\* cited by examiner

FIG. 17A1
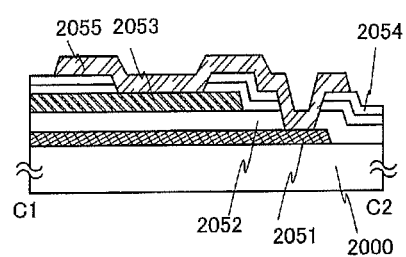
FIG. 17A2
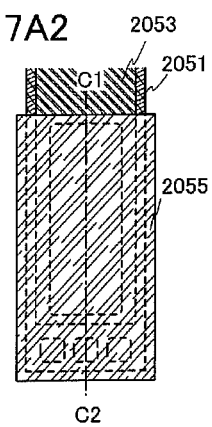
FIG. 17B1
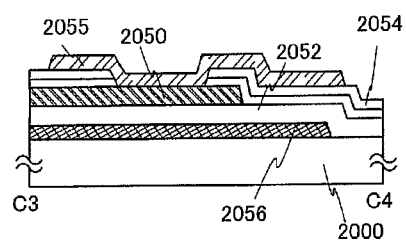
FIG. 17B2
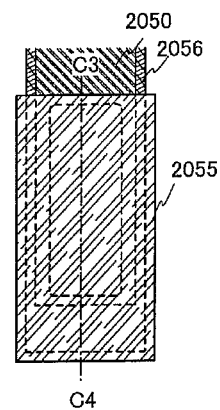

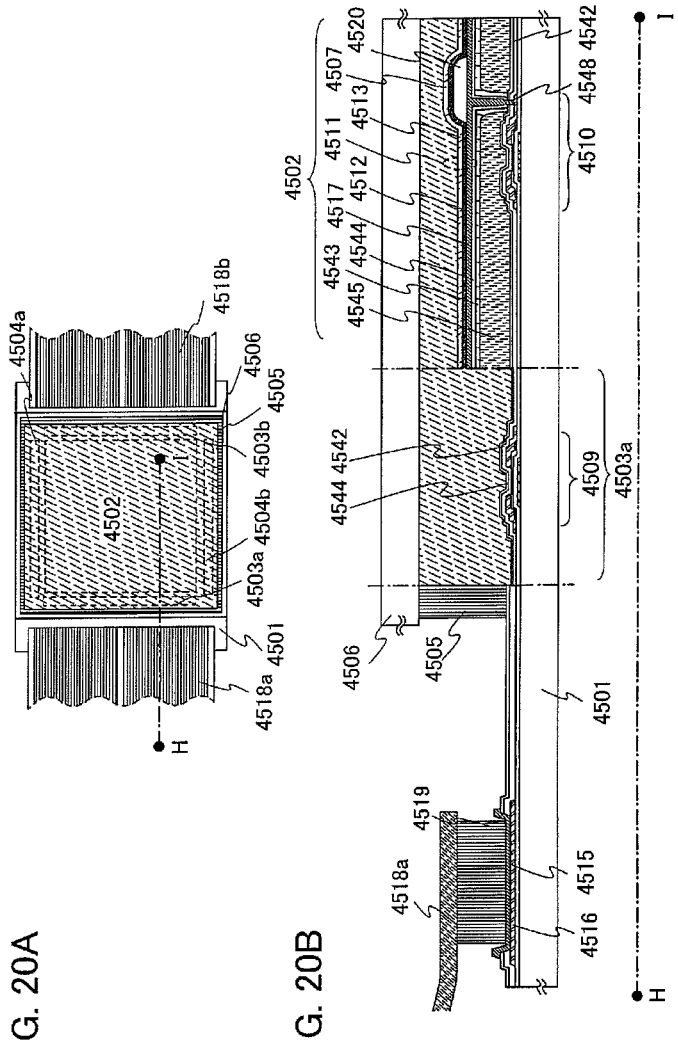

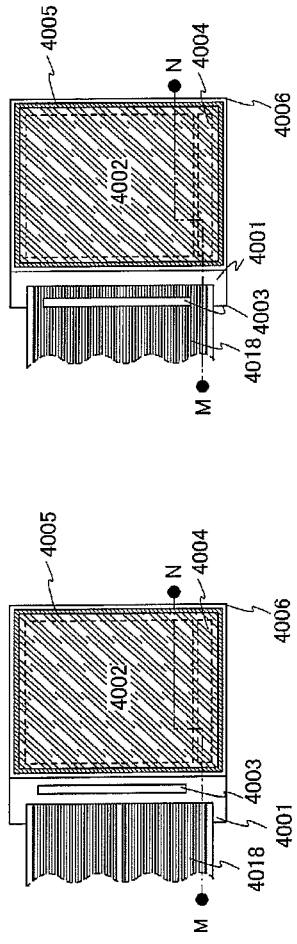
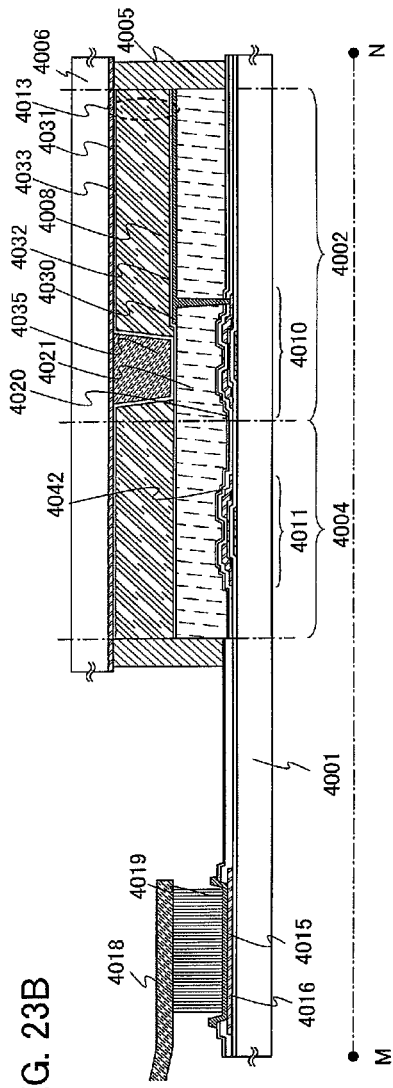
FIG. 23A1
FIG. 23A2
FIG. 23B

SHIFT REGISTER AND DISPLAY DEVICE

TECHNICAL FIELD

The present invention relates to a shift register and a display device provided with a driver circuit including the shift register.

BACKGROUND ART

A thin film transistor (TFT) formed over a flat plate such as a glass substrate, which is typically used in a liquid crystal display device, is generally formed using a semiconductor material such as amorphous silicon or polycrystalline silicon. Although TFTs formed using amorphous silicon have low field-effect mobility, they have an advantage that larger glass substrates can be used. On the other hand, TFTs formed using polycrystalline silicon have high field-effect mobility but need a crystallization step such as laser annealing and are not always adaptable to increase in size of glass substrates.

In view of the foregoing, TFT formed using an oxide semiconductor as a semiconductor material has attracted attention. For example, Patent Documents 1 and 2 each disclose a technique in which a TFT is formed using zinc oxide or an In—Ga—Zn—O-based oxide semiconductor as a semiconductor material and used for a switching element in an image display device.

A TFT in which a channel formation region is provided in an oxide semiconductor can have a higher electric-field mobility than a TFT formed using amorphous silicon. Further, an oxide semiconductor film can be formed at a temperature of 300° C. or lower by a sputtering method or the like, and a manufacturing process of the TFT formed using an oxide semiconductor is simpler than that of the TFT formed using polycrystalline silicon.

TFTs which are formed using such an oxide semiconductor are expected to be applied to switching elements included in a pixel portion and a driver circuit of a display device such as a liquid crystal display, an electroluminescent display (also referred to as an EL display), and electronic paper. For example, Non-Patent Document 1 discloses a technique by which a pixel portion and a driver circuit of a display device include TFTs formed using the above oxide semiconductor.

Note that the TFTs formed using the above oxide semiconductor are all n-channel transistors. Therefore, in the case where a driver circuit includes a thin film transistor formed using an oxide semiconductor, the driver circuit includes only n-channel transistors (hereinafter also referred to as a unipolar transistor).

REFERENCE

[Patent Document 1] Japanese Published Patent Application No. 2007-123861
[Patent Document 2] Japanese Published Patent Application No. 2007-096055
[Non-Patent Document 1] T. Osada, et al., SID 09 DIGEST, pp. 184-187 (2009)

DISCLOSURE OF INVENTION

A driver circuit includes a shift register, a buffer, and the like. For example, in the case where the shift register includes only unipolar transistors, there is a problem in that voltage of an output signal of each of flip-flops decreases or increases by the same amount as the threshold voltage of the transistor. Therefore, bootstrap operation is often performed in a portion where such a problem occurs. Further, in the case where a load of a driver circuit in which bootstrap operation is performed becomes heavy, parasitic capacitance generated in the driver circuit becomes large. As a result, there is a problem in that power consumption of a shift register used in the driver circuit increases due to the parasitic capacitance.

An object of one embodiment of the present invention is to reduce power consumption of a shift register.

According to one embodiment of the present invention, flip-flops in a shift register are supplied with clock signals of as many kinds as possible, whereby each of the flip-flops can operate more selectively during each operation period, leading to a reduction in power consumption.

One embodiment of the present invention is a shift register including a first flip-flop to which a first clock signal which is in a first voltage state in a first period and in a second voltage state in second to fourth periods is input; a second flip-flop to which a second clock signal which is in the first voltage state in at least part of the second period and in the second voltage state in at least part of the third period, and the fourth period is input; a third flip-flop to which a third clock signal which is in the second voltage state in the first, second, and fourth periods and in the first voltage state in the third period is input; and a fourth flip-flop to which a fourth clock signal which is in the second voltage state in at least part of the first period, and the second period and in the first voltage state in at least part of the fourth period is input.

One embodiment of the present invention may be a shift register including a first clock signal line to which the first clock signal is input, a second clock signal line to which the second clock signal is input, a third clock signal line to which the third clock signal is input, a fourth clock signal line to which the fourth clock signal is input, a first power supply line to which a high power supply voltage is supplied, and a second power supply line to which a low power supply voltage is supplied. Each of the first to fourth flip-flops includes a first transistor including a gate, a source, and a drain, a second transistor including a gate, a source, and a drain, and a third transistor including a gate, a source, and a drain. In the first transistor, a start signal is input to the gate, and one of the source and the drain is electrically connected to the first power supply line. In the second transistor, the gate is electrically connected to the other of the source and the drain of the first transistor, one of the source and the drain is electrically connected to one of the first to fourth clock signal lines, and an output signal is output through the other of the source and the drain. In the third transistor, one of the source and the drain is electrically connected to the gate of the second transistor, and the other of the source and the drain is electrically connected to the second power supply line.

One embodiment of the present invention may be a shift register in which the first to third transistors have the same conductivity type.

One embodiment of the present invention may be a shift register in which each of the first to third transistors includes an oxide semiconductor layer serving as a channel formation layer.

One embodiment of the present invention is a display device including a driver circuit having any one of the shift registers described above and a pixel portion having a pixel whose display state is controlled by the driver circuit.

One embodiment of the present invention is a method for driving a shift register including first to fourth flip-flops, including the steps of: inputting a first clock signal, which is in a first voltage state in a first period and in a second voltage state in second to fourth periods, to the first flip-flop; inputting a second clock signal, which is in the first voltage state in at least part of the second period and in the second voltage state in at least part of the third period, and the fourth period, to the second flip-flop; inputting a third clock signal, which is in the second voltage state in the first, second, and fourth periods and in the first voltage state in the third period, to the third flip-flop; and inputting a fourth clock signal, which is in the second voltage state in at least part of the first period, and the second period and in the first voltage state in at least part of the fourth period, to the fourth flip-flop.

According to one embodiment of the present invention, a flip-flop can operate more selectively, whereby power consumption of a shift register can be reduced.

BRIEF DESCRIPTION OF DRAWINGS

In the accompanying drawings:

FIGS. 17A1 to 17B2 are views illustrating structures of a pixel in a display device in Embodiment 7;

FIGS. 20A and 20B illustrate a structure of a display device in Embodiment 8;

FIGS. 23A1, 23A2 to 23B illustrates structures of a display device in Embodiment 10;

BEST MODE FOR CARRYING OUT THE INVENTION

Hereinafter, embodiments of the present invention will be described with reference to the drawings. Note that the present invention is not limited to the following description, and it will be easily understood by those skilled in the art that various changes and modifications can be made without departing from the spirit and scope of the present invention. Thus, the present invention should not be interpreted as being limited to the following description of the embodiments.

Embodiment 1

In this embodiment, a shift register which is one embodiment of the present invention will be described.

Figure 1:
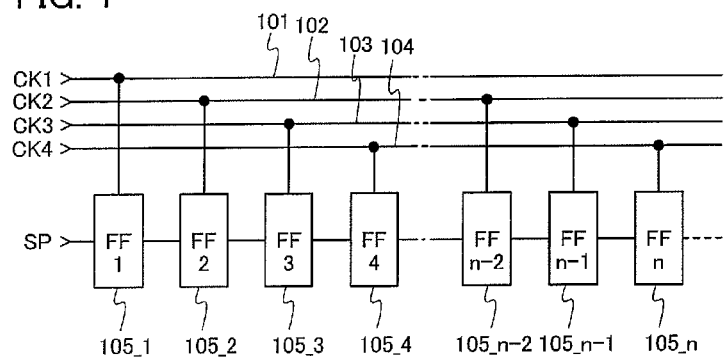
FIG. 1 is a circuit block diagram illustrating an example of a structure of a shift register in Embodiment 1.

A structure of the shift register in this embodiment is described with reference to FIG. 1. FIG. 1 is a circuit block diagram illustrating an example of a structure of the shift register in this embodiment.

The shift register in FIG. 1 includes a plurality of clock signal lines and a flip-flop of a plurality of stages including a plurality of flip-flops which are electrically connected to at least one of the plurality of clock signal lines. Each of clock signals input to the plurality of clock signal lines becomes high level and low level at a timing different from one another. Note that FIG. 1 is an example of the shift register including a flip-flop in a first stage (also referred to as a flip-flop $105\_1$ or FF1) electrically connected to a clock signal line 101, a flip-flop in a second stage (also referred to as a flop-flop $105\_2$ or FF2) electrically connected to a clock signal line 102, a flip-flop in a third stage (also referred to as a flip-flop $105\_3$ or FF3) electrically connected to a clock signal line 103, a flip-flop in a fourth stage (also referred to as a flip-flop $105\_4$ or FF4) electrically connected to a clock signal line 104, a flip-flop in an (n−2)-th stage (n is a natural number of 4 or more) (also referred to as a flip-flop $105\_n-2$ or FFn-2), a flip-flop in an (n−1)-th stage (also referred to as a flip-flop $105\_n-1$ or FFn-1), and a flip-flop in an n-th stage (also referred to as a flip-flop $105\_n$ or FFn). However, there is no limitation and the shift register may include at least a first flip-flop, a second flip-flop, a third flip-flop, and a fourth flip-flop. Further, the first to fourth flip-flops are not necessarily adjacent to the flip-flop in the next stage. For example, flip-flops in every plural stages may be referred to as a first flip-flop, a second flip-flop, a third flip-flop, and a fourth flip-flop in order.

The clock signal line 101 is a wiring to which a clock signal CK1 is input. The clock signal CK1 preferably has a duty ratio of 25% or less. Here, description is made assuming the clock signal CK1 has a duty ratio of 25%.

The clock signal line 102 is a wiring to which a clock signal CK2 is input. The clock signal CK2 preferably has a duty ratio of 25% or less. Here, description is made assuming the clock signal CK2 has a duty ratio of 25%.

The clock signal line 103 is a wiring to which a clock signal CK3 is input. The clock signal CK3 preferably has a duty ratio of 25% or less. Here, description is made assuming the clock signal CK3 has a duty ratio of 25%.

The clock signal line 104 is a wiring to which a clock signal CK4 is input. The clock signal CK4 preferably has a duty ratio of 25% or less. Here, description is made assuming the clock signal CK4 has a duty ratio of 25%.

Each of the clock signals CK1 to CK4 can be generated by an AND circuit, for example. For example, two clock signals having different pulse widths are input to the AND circuit as input signals, whereby in the AND circuit, a voltage state is set in accordance with the two input clock signals and any one of the clock signals CK1 to CK4 is output as an output signal. At this time, a duty ratio of the output clock signal can be set as appropriate in accordance with the pulse widths of the two input clock signals.

When a signal SP as a start signal (also referred to as a set signal) and the clock signal CK1 as a clock signal are input to the flip-flop 105_1, the flip-flop 105_1 has a function of outputting a signal FF1out as an output signal, whose state is set in accordance with the input signal SP and the clock signal CK1.

Note that in this specification, the state of a signal refers to a voltage, a current, or a frequency of the signal, for example.

Note that in general, a voltage refers to the difference between potentials of two points (also referred to as the potential difference). However, both the level of a voltage and the value of a potential are represented by volts (V) in a circuit diagram or the like; therefore, it is difficult to distinguish voltage and potential. Thus, in the document (the specification and the scope of claims) of the present application, the phrase "voltage at one point" refers to a potential difference between the one point and a reference potential unless otherwise specified.

Note that as a signal in this specification, an analog signal or a digital signal which uses voltage, current, resistance, frequency, or the like can be used, for example. For example, as a signal with voltage (also referred to as a voltage signal), it is preferable to use a signal having at least a first voltage state and a second voltage state. A binary digital signal which has a high-level voltage state as the first voltage state and a low-level voltage state as the second voltage state can be used, for example. Note that in a binary digital signal, a high-level voltage is also referred to as $V_H$ and a low-level voltage is also referred to as $V_L$. Moreover, each of a voltage in the first voltage state and a voltage in the second voltage state preferably has a fixed value. However, since noise or the like, for example, has an influence on an electronic circuit, each of the voltage in the first voltage state and the voltage in the second voltage state does not necessarily have a fixed value and may be a value within a fixed range.

Further, in this specification, terms with ordinal numbers such as "first" and "second" are used in order to avoid confusion among components, and the terms do not limit the components numerically.

When the signal FF1out, which is the output signal of the flip-flop 105_1, as a start signal and the clock signal CK2 as a clock signal are input to the flip-flop 105_2, the flip-flop 105_2 has a function of outputting a signal FF2out as an output signal, whose state is set in accordance with the input signal FF1out and the clock signal CK2.

When the signal FF2out, which is the output signal of the flip-flop 105_2, as a start signal and the clock signal CK3 as a clock signal are input to the flip-flop 105_3, the flip-flop 105_3 has a function of outputting a signal FF3out as an output signal, whose state is set in accordance with the input signal FF2out and the clock signal CK3.

When the signal FF3out, which is the output signal of the flip-flop 105_3, as a start signal and the clock signal CK4 as a clock signal are input to the flip-flop 105_4, the flip-flop 105_4 has a function of outputting a signal FF4out as an output signal, whose state is set in accordance with the input signal FF3out and the clock signal CK4.

Figure 2:
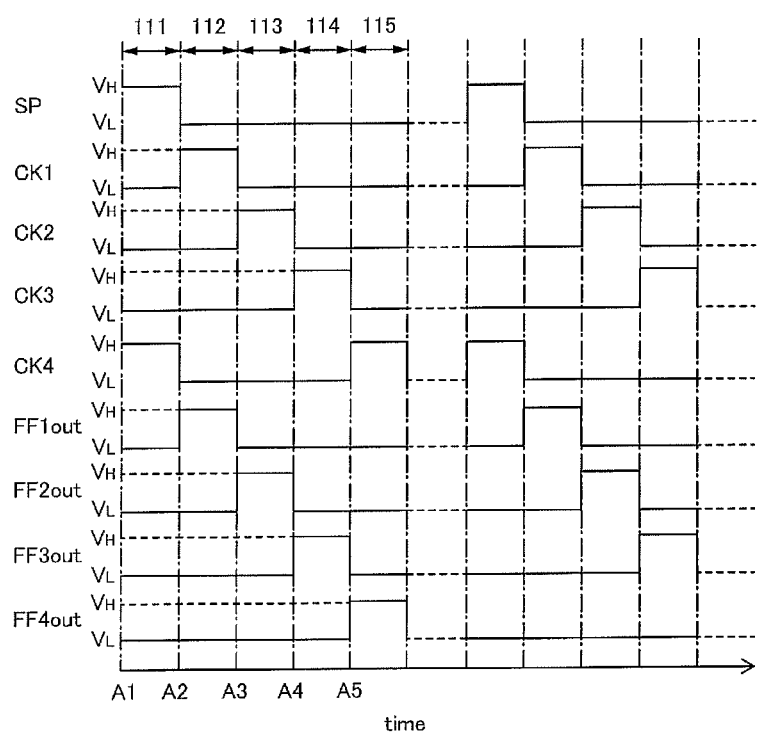
FIG. 2 is a timing chart illustrating an example of operation of the shift register illustrated in FIG. 1.

Next, as an example of operation (also referred to as a driving method) of the shift register of this embodiment, operation of the flip-flops 105_1 to 105_4 is described with reference to FIG. 2. FIG. 2 is a timing chart illustrating an example of operation of the shift register in FIG. 1 and illustrates waveforms of the signal SP, the clock signal CK1, the clock signal CK2, the clock signal CK3, the clock signal CK4, the signal FF1out, the signal FF2out, the signal FF3out, and the signal FF4out. Note that in the example of operation of the shift register in FIG. 1, which is described with reference to FIG. 2, the signal SP, the clock signal CK1, the clock signal CK2, the clock signal CK3, the clock signal CK4, the signal FF1out, the signal FF2out, the signal FF3out, and the signal FF4out each are a binary digital signal. Further, in the operation of the shift register in this embodiment, the same operation can be performed even when the voltage states of the signal SP, the clock signal CK1, the clock signal CK2, the clock signal CK3, the clock signal CK4, the signal FF1out, the signal FF2out, the signal FF3out, and the signal FF4out in FIG. 2 are all inverted.

As illustrated in FIG. 2, in the example of the shift register in FIG. 1, a period can be divided into a period 111, a period 112, a period 113, a period 114, and a period 115. Note that in this specification, the length of each period can be set as appropriate in accordance with each clock signal, for example. Here, as an example, the length of each period is equal and the operation in each period is described below.

First, at a time A1, the signal SP is set to high level, the clock signal CK1 is set to low level, the clock signal CK2 is set to low level, the clock signal CK3 is set to low level, and the clock signal CK4 is set to high level. In the period 111, the signal SP is at high level, the clock signal CK1 is at low level, the clock signal CK2 is at low level, the clock signal CK3 is at low level, and the clock signal CK4 is at high level.

At this time, the flip-flop 105_1 is set to a set state. Moreover, the signal FF1out is set to low level in accordance with the voltage states of the signal SP and the clock signal CK1. The signal FF2out is set to low level in accordance with the voltage states of the signal FF1out and the clock signal CK2. The signal FF3out is set to low level in accordance with the voltage states of the signal FF2out and the clock signal CK3. The signal FF4out is set to low level in accordance with the voltage states of the signal FF3out and the clock signal CK4.

Then, at a time A2, the signal SP is set to low level, the clock signal CK1 is set to high level, the clock signal CK2 remains at low level, the clock signal CK3 remains at low level, and the clock signal CK4 is set to low level. In the period 112, the signal SP is at low level, the clock signal CK1 is at high level, the clock signal CK2 is at low level, the clock signal CK3 is at low level, and the clock signal CK4 is at low level.

At this time, the signal FF1out is set to high level in accordance with the voltage states of the signal SP and the clock signal CK1. The signal FF2out is at low level in accordance with the voltage states of the signal FF1out and the clock signal CK2. The signal FF3out is at low level in accordance with the voltage states of the signal FF2out and the clock signal CK3. The signal FF4out is at low level in accordance with the voltage states of the signal FF3out and the clock signal CK4.

Next, at a time A3, the signal SP remains at low level, the clock signal CK1 is set to low level, the clock signal CK2 is set to high level, the clock signal CK3 remains at low level, and the clock signal CK4 remains at low level. In the period 113, the signal SP is at low level, the clock signal CK1 is at low level, the clock signal CK2 is at high level, the clock signal CK3 is at low level, and the clock signal CK4 is at low level.

At this time, the signal FF1out is set to low level in accordance with the voltage states of the signal SP and the clock signal CK1. The signal FF2out is set to high level in accordance with the voltage states of the signal FF1out and the clock signal CK2. The signal FF3out remains at low level in accordance with the voltage states of the signal FF2out and the clock signal CK3. The signal FF4out remains at low level in accordance with the voltage states of the signal FF3out and the clock signal CK4.

Next, at a time A4, the signal SP remains at low level, the clock signal CK1 remains at low level, the clock signal CK2 is set to low level, the clock signal CK3 is set to high level, and the clock signal CK4 remains at low level. In the period 114, the signal SP is at low level, the clock signal CK1 is at low level, the clock signal CK2 is at low level, the clock signal CK3 is at high level, and the clock signal CK4 is at low level.

At this time, the signal FF1out remains at low level in accordance with the voltage states of the signal SP and the clock signal CK1. The signal FF2out is set to low level in accordance with the voltage states of the signal FF1out and the clock signal CK2. The signal FF3out is set to high level in accordance with the voltage states of the signal FF2out and the clock signal CK3. The signal FF4out remains at low level in accordance with the voltage states of the signal FF3out and the clock signal CK4.

Next, at a time A5, the signal SP remains at low level, the clock signal CK1 remains at low level, the clock signal CK2 remains at low level, the clock signal CK3 is set to low level, and the clock signal CK4 is set to high level. In the period 115, the signal SP is at low level, the clock signal CK1 is at low level, the clock signal CK2 is at low level, the clock signal CK3 is at low level, and the clock signal CK4 is at high level.

At this time, the signal FF1out remains at low level in accordance with the voltage states of the signal SP and the clock signal CK1. The signal FF2out remains at low level in accordance with the voltage states of the signal FF1out and the clock signal CK2. The signal FF3out is set to low level in accordance with the voltage states of the signal FF2out and the clock signal CK3. The signal FF4out is set to high level in accordance with the voltage states of the signal FF3out and the clock signal CK4.

As described above, the shift register of this embodiment has a structure in which a plurality of clock signals is input to one of flip-flops with the use of at least a first clock signal (e.g., the clock signal CK1), a second clock signal (e.g., the clock signal CK2), a third clock signal (e.g., the clock signal CK3), and a fourth clock signal (e.g., the clock signal CK4), each of whose voltage state is changed at a different timing. Thus, when a flip-flop to which a clock signal is input is in an operating state (e.g., in a state where a high-level signal is input), each of flip-flops to which other signals are input can be set to a non-operating state (e.g., in a state where a low-level signal is input). Accordingly, power consumption can be reduced.

Embodiment 2

In this embodiment, an example of a circuit structure of a flip-flop in a shift register which is one embodiment of the present invention will be described.

Figure 3:
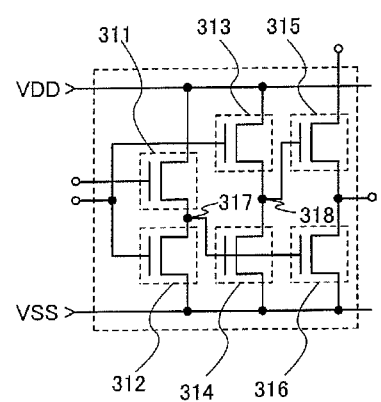
FIG. 3 is a circuit diagram illustrating an example of a circuit structure of a flip-flop in Embodiment 2.

An example of the circuit structure of the flip-flop of this embodiment is described with reference to FIG. 3. FIG. 3 is a circuit diagram illustrating an example of the circuit structure of the flip-flop in this embodiment.

The flip-flop in FIG. 3 includes a transistor 311, a transistor 312, a transistor 313, a transistor 314, a transistor 315, and a transistor 316. Note that as an example, all the transistors in the flip-flop in this embodiment have a gate, a source, and a drain, and are field effect transistors of the same conductivity type. When all the transistors have the same conductivity type, the number of manufacturing steps can be reduced as compared to the case where transistors with different conductivity types are used. In FIG. 3, an example in which all the transistors in the flip-flop are n-channel transistors is illustrated; however, there is no limitation and all the transistors in the flip-flop may be p-channel transistors.

The gate refers to all or part of a gate electrode and a gate wiring. The gate wiring is a wiring for electrically connecting a gate electrode of at least one transistor to another electrode or another wiring. For example, a scan line in a display device is a gate wiring.

The source refers to all or part of a source region, a source electrode, and a source wiring. The source region is a region in a semiconductor layer, where the resistivity is lower than that of a channel formation region (a channel formation layer). The source electrode is part of a conductive layer, which is connected to the source region. The source wiring is a wiring for electrically connecting a source electrode of at least one transistor to another electrode or another wiring. For example, in the case where a signal line in a display device is electrically connected to a source electrode, the signal line is also a source wiring.

The drain refers to all or part of a drain region, a drain electrode, and a drain wiring. The drain region is a region in a semiconductor layer, where the resistivity is lower than that of a channel formation region (a channel formation layer). The drain electrode is part of a conductive layer, which is connected to the drain region. The drain wiring is a wiring for electrically connecting a drain electrode of at least one transistor to another electrode or another wiring. For example, in the case where a signal line in a display device is electrically connected to a drain electrode, the signal line is also a drain wiring.

In addition, in this document (the specification, the scope of claims, the drawings, and the like), a source and a drain of a transistor may interchange depending on the structure, the operating conditions, or the like of the transistor; therefore, it is difficult to define which is a source or a drain. Accordingly, in this document (the specification, the scope of claims, the drawings, and the like), one terminal which is arbitrarily selected from a source and a drain is referred to as one of the source and the drain, whereas the other terminal is referred to as the other of the source and the drain.

In the transistor 311, a signal S31 is input to the gate and a high power supply voltage VDD is supplied to one of the source and the drain.

In the transistor 312, a signal S32 is input to the gate, one of the source and the drain is electrically connected to the other of the source and the drain of the transistor 311, and a low power supply voltage VSS is supplied to the other of the source and the drain.

In the transistor 313, the signal S32 is input to the gate and the high power supply voltage VDD is supplied to one of the source and the drain.

In the transistor 314, the gate is electrically connected to the other of the source and the drain of the transistor 311, one of the source and the drain is electrically connected to the other of the source and the drain of the transistor 313, and the low power supply voltage VSS is supplied to the other of the source and the drain. Note that a portion where the gate of the transistor 314 is connected to the other of the source and the drain of the transistor 311 is also referred to as a node 317.

In the transistor 315, a gate is electrically connected to the other of the source and the drain of the transistor 313 and the signal S33 is input to one of a source and a drain. Note that a portion where the gate of the transistor 315 is connected to the other of the source and the drain of the transistor 313 is also referred to as a node 318.

In the transistor 316, the gate is electrically connected to the other of the source and the drain of the transistor 311, one of the source and the drain is electrically connected to the other of the source and the drain of the transistor 315, and the low power supply voltage VSS is supplied to the other of the source and the drain.

The flip-flop in FIG. 3 outputs the voltage at the other of the source and the drain of the transistor 315 as a signal S34.

Note that the signal S31 can function as a start signal $SP_{FF}$ of the flip-flop and corresponds to the signal SP in Embodiment 1, for example.

The signal S32 can function as a reset signal $RE_{FF}$ of the flip-flop. For example, in the case where a flip-flop which follows a flip-flop of the following stage is included, the output signal of the flip-flop which follows the following stage is input.

The signal S33 can function as a clock signal $CK_{FF}$ of the flip-flop and corresponds to any one of the signals CK1 to CK3 in Embodiment 1, for example.

The signal S34 can function as an output signal $OUT_{FF}$ of the flip-flop and corresponds to any one of the signals FF1out to FFnout in Embodiment 1, for example.

As illustrated in FIG. 3, one example of the flip-flop of this embodiment includes at least a first transistor (e.g., the transistor 313) in which a start signal is input to a gate and one of a source and a drain is electrically connected to a first power supply line; a second transistor (e.g., the transistor 315) in which a gate is electrically connected to the other of the source and the drain of the first transistor, one of a source and a drain is electrically connected to one of first to third clock signal lines, and an output signal is output from the other of the source and the drain; and a third transistor (e.g., the transistor 314) in which one of a source and a drain is electrically connected to the gate of the second transistor and the other of the source and the drain is electrically connected to a second power supply line. In this structure, parasitic capacitance might be generated in each of the transistors in some cases. For example, the second transistor is designed to have a wider channel width as compared to those of the other transistors included in the flip-flop in some cases, resulting in generation of large parasitic capacitance. However, with the structure of the shift register which is one embodiment of the present invention, a clock signal in a first voltage state can be selectively output to the flip-flop, whereby power consumption can be reduced.

Figure 4:
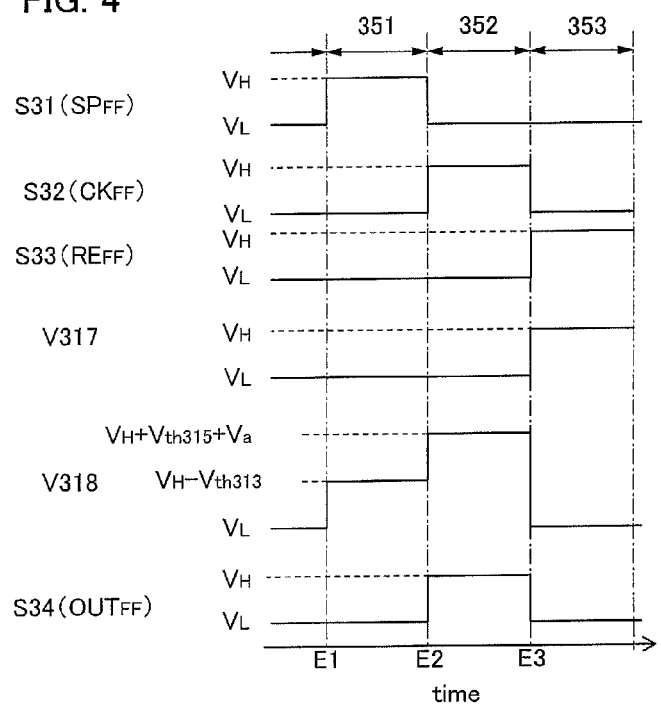
FIG. 4 is a timing chart illustrating an example of operation of the flip-flop illustrated in FIG. 3.

Next, an example of operation of the flip-flop in this embodiment will be described with reference to FIG. 4. FIG. 4 is a timing chart illustrating an example of operation of the flip-flop in FIG. 3. Note that in the example of the operation of the flip-flop in FIG. 3, which is described with reference to FIG. 4, each of the signals S31 to S34 is a binary digital signal, the high power supply voltage VDD has a value equal to that of the high-level signal voltage $V_H$, and the lower power supply voltage VSS has a value equal to that of the low-level signal voltage $V_L$. Further, in the operation of the flip-flop in this embodiment, the voltage state of each signal illustrated in FIG. 4 can be inverted.

In the example of the operation of the flip-flop in FIG. 3, a period can be divided into a period 351, a period 352, and a period 353 as illustrated in FIG. 4. The operation in each period is described below.

First, in the period 351, at a time E1, the signal S31 is set to high level, the signal S32 is set to low level, and the signal S33 is set to low level.

At this time, the flip-flop in FIG. 3 is set to a set state. Further, the transistor 312 is turned on and the voltage of the node 317 becomes $V_L$. Moreover, the transistor 313 is turned on and the voltage of the node 318 starts to increase. The voltage of the node 318 (also referred to as V318) increases to "$V_H$–$V_{th313}$" (the threshold voltage of the transistor 313). When the voltage of the node 318 reaches "$V_H$–$V_{th313}$", the transistor 313 is turned off and the node 318 is set to a floating state. Moreover, when the absolute value of the voltage of the node 318 becomes larger than the absolute value of the threshold voltage of the transistor 315 ($V_{th315}$), the transistor 315 is turned on and the signal S34 is set to low level.

Next, in the period 352, at a time E2, the signal S31 is set to low level, the signal S32 is set to high level, and the signal S33 is at low level.

Since the transistor 313 is kept off at this time, the voltage of the node 318 remains at "$V_H$–$V_{th313}$".

When the voltage of the node 318 remains at "$V_H$–$V_{th313}$", the transistor 315 is kept on. When the voltage of one of the source and the drain of the transistor 315 is at $V_H$, the voltage of the other of the source and the drain of the transistor 315 starts to increase. Accordingly, since the node 318 is in a floating state, the voltage of the node 318 starts to increase in accordance with the voltage of an output signal because of capacitive coupling of capacitance (e.g., parasitic capacitance) generated between the gate and the other of the source and the drain of the transistor 315. This is so-called bootstrap operation.

The voltage of the node 318 increases to a value larger than the sum of the voltage of the node 318 in the period 351 and the threshold voltage of the transistor 315, that is, "$V_H$+$V_{th315}$+$V_a$" ($V_a$ is a given positive value). At this time, the transistor 315 is kept on and the signal S34 is set to high level.

Next, in the period 353, at a time E3, the signal S31 is set to low level, the signal S32 is set to low level, and the signal S33 is set to high level.

At this time, the transistor 311 is turned on and the voltage of the node 317 becomes $V_H$. Moreover, the transistor 314 is turned on, the voltage of the node 318 starts to decrease to $V_L$, the flip-flop is set to a reset state. The transistor 315 is kept off and the signal S34 is kept at low level in the reset state.

As illustrated in FIG. 3 and FIG. 4 as examples, the flip-flop in this embodiment can be formed field-effect transistors of the same conductivity type, for example. With the use of the transistors of the same conductivity type, the number of manufacturing steps can be reduced as compared to the case where transistors with different conductivity types are used. Further, even in the case where the flip-flop includes the transistors of the same conductivity type, power consumption of the shift register of one embodiment of the present invention can be reduced.

Note that this embodiment can be combined with or replaced by any of the other embodiments as appropriate.

Embodiment 3

In this embodiment, an example of a transistor which is applicable to the shift register of one embodiment of the present invention will be described.

Figure 5A:
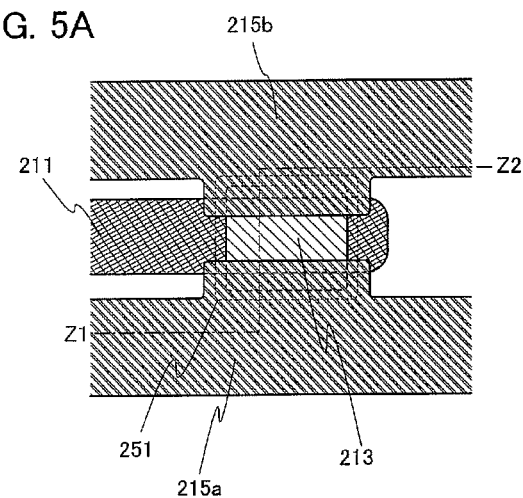
FIGS. 5A to 5C are examples of structures of transistors which are applicable to a shift register which is one embodiment of the present invention in Embodiment 3.
Figure 5B:
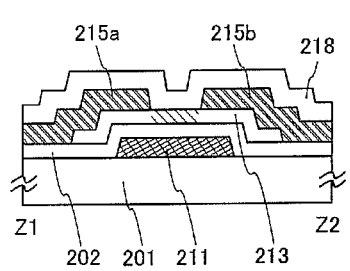
Figure 5C:
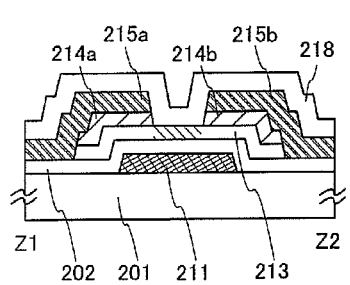

Examples of structures of the transistors in this embodiment will be described with reference to FIGS. 5A to 5C. FIGS. 5A to 5C illustrate examples of the structures of the transistors in this embodiment. FIG. 5A is a top view and FIG. 5B is a cross-sectional view taken along line Z1-Z2 in FIG. 5A.

The transistor in FIGS. 5A and 5B includes a gate electrode 211, a gate insulating layer 202, an oxide semiconductor layer 213, a conductive layer 215a, and a conductive layer 215b.

The gate electrode 211 is provided over a substrate 201 as illustrated in FIG. 5B, for example.

The gate insulating layer 202 is provided over the gate electrode 211.

The oxide semiconductor layer 213 is provided over the gate electrode 211 with the gate insulating layer 202 therebetween. The oxide semiconductor layer 213 includes a channel formation region. Moreover, the oxide semiconductor layer 213 is subjected to dehydration or dehydrogenation treatment when formed.

Each of the conductive layer 215a and the conductive layer 215b is provided over part of the oxide semiconductor layer 213. The conductive layer 215a and the conductive layer 215b each function as a source electrode or a drain electrode of the transistor.

Further, as for the transistor in FIGS. 5A and 5B, the oxide semiconductor layer is subjected to dehydration or dehydrogenation treatment, and moreover, an oxide insulating layer 218 is formed in contact with part of the oxide semiconductor layer 213. In the transistor including the oxide semiconductor layer 213 as a channel formation layer, in which the oxide insulating layer 218 is formed after the dehydration or dehydrogenation treatment is performed, the Vth shift due to long-term use and large load hardly occurs and thus reliability is high.

Note that a nitride insulating layer may be provided over the oxide insulating layer 218. It is preferable that the nitride insulating layer be in contact with the gate insulating layer 202 provided below the oxide insulating layer 218 or an insulating layer serving as a base, so that impurities such as moisture, hydrogen ions, and OH$^-$ from the vicinity of side surfaces of the substrate are prevented from entering. In particular, it is effective to use a silicon nitride layer for the gate insulating layer 202 in contact with the oxide insulating layer 218 or the insulating layer serving as a base. That is, when the silicon nitride layers are provided so as to surround a lower surface, an upper surface, and side surfaces of the oxide semiconductor layer 213, reliability of the display device is improved.

Further, a planarization insulating layer may be provided over the oxide insulating layer 218 (over the nitride insulating layer in the case where the nitride insulating layer is provided).

Alternatively, as illustrated in FIG. 5C, the transistor 251 may have a structure in which an oxide conductive layer 214a and an oxide conductive layer 214b are provided over parts of the oxide semiconductor layer 213, the conductive layer 215a is provided so as to be in contact with the oxide conductive layer 214a, and the conductive layer 215b is provided so as to be in contact with the oxide conductive layer 214b.

The oxide conductive layer 214a and the oxide conductive layer 214b have conductivity higher than that of the oxide semiconductor layer 213 and function as a source region (also referred to as a low-resistance source region) and a drain region (also referred to as a low-resistance drain region) of the transistor 251.

As a material of the oxide conductive film used for forming the oxide conductive layer 214a and the oxide conductive layer 214b, a conductive material having a light-transmitting property with respect to visible light, such as an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—Sn—O-based metal oxide, an In—O-based metal oxide, an Sn—O-based metal oxide, or a Zn—O-based metal oxide, can be employed. The thickness of the oxide conductive film is selected as appropriate in the range of greater than or equal to 1 nm and less than or equal to 300 nm. In the case of employing a sputtering method, film deposition is performed with the use of a target containing $SiO_2$ at greater than or equal to 2 wt % and less than or equal to 10 wt %, so that $SiO_x$ (x>0) which hinders crystallization is contained in the light-transmitting conductive film. Thus, it is preferable that the light-transmitting conductive film be prevented from being crystallized in heat treatment for dehydration or dehydrogenation performed later.

For example, in the case where an In—Ga—Zn—O-based film is used for the oxide semiconductor layer, the oxide semiconductor layer 213 serving as a channel formation region and the oxide conductive layer 214a and the oxide conductive layer 214b can be separately formed under different deposition conditions.

For example, in the case where the deposition is performed by a sputtering method, the oxide conductive layer 214a and the oxide conductive layer 214b which are formed using an oxide semiconductor film formed in an argon gas each have n-type conductivity and an activation energy (ΔE) of 0.01 eV to 0.1 eV inclusive.

Note that in this embodiment, as an example, the oxide conductive layers 214a and 214b are In—Ga—Zn—O-based films and include at least amorphous components. Moreover, the oxide conductive layers 214a and 214b may include crystal grains (also referred to as nanocrystals). The crystal grains in the oxide conductive layers 214a and 214b have a diameter of approximately 1 nm to 10 nm, typically approximately 2 nm to 4 nm.

The oxide conductive layers 214a and 214b are not necessarily provided, but when the oxide conductive layers 214a and 214b are provided between the oxide semiconductor layer 213 serving as a channel formation layer and the conductive layers 215a and 215b serving as a source electrode and a drain electrode, favorable electrical junctions can be obtained and the transistor 251 can operate stably.

Figure 6A:
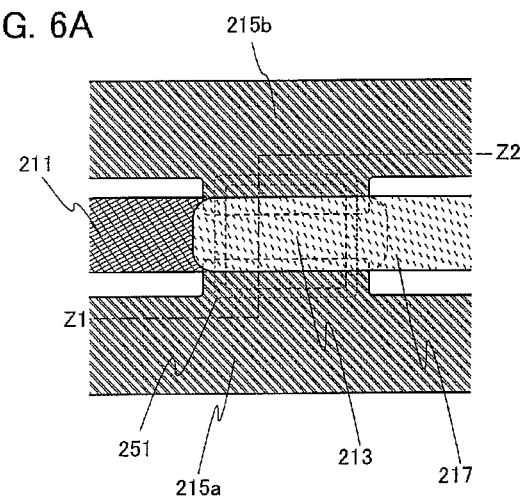
FIGS. 6A and 6B are another example of a structure of a transistor which is applicable to a shift register which is one embodiment of the present invention in Embodiment 3.
Figure 6B:
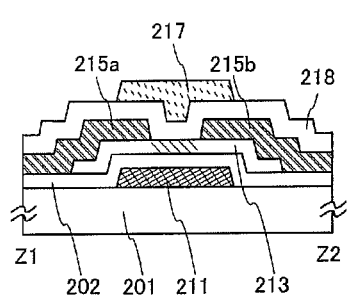

Alternatively, the transistor in FIGS. 5A and 5B may have a structure in FIGS. 6A and 6B, in which a conductive layer 217 is provided over the oxide semiconductor layer 213 with the oxide insulating layer 218 therebetween (with the oxide insulating layer 218 and the nitride insulating layer therebetween in the case where the nitride insulating layer is provided). FIGS. 6A and 6B illustrate an example of the structure of the transistor in this embodiment. FIG. 6A is a top view and FIG. 6B is a cross-sectional view taken along line Z1-Z2 in FIG. 6A. The conductive layer 217 functions as a second gate electrode. A second gate voltage is applied to the conductive layer 217, whereby the threshold voltage of the transistor 251 can be controlled. In the case where a planarization insulating layer is provided, the conductive layer 217 can be provided over the planarization insulating layer.

For example, when a voltage equal to or higher than that of the source electrode is applied to the conductive layer 217, the threshold voltage of the transistor is shifted to a negative side; when a voltage lower than that of the source electrode is applied to the conductive layer 217, the threshold voltage of the transistor is shifted to a positive side.

As illustrated in FIGS. 5A to 5C and FIGS. 6A and 6B as examples, the transistors of this embodiment are transistors each including an oxide semiconductor layer serving as a channel formation layer. Accordingly, the transistors of this embodiment have mobility higher than that of the conventional transistor including an amorphous silicon layer for a channel formation layer, and thus high-speed operation is possible. Further, even when the transistors of this embodiment are used, power consumption of the shift register of one embodiment of the present invention can be reduced.

Figure 7A:
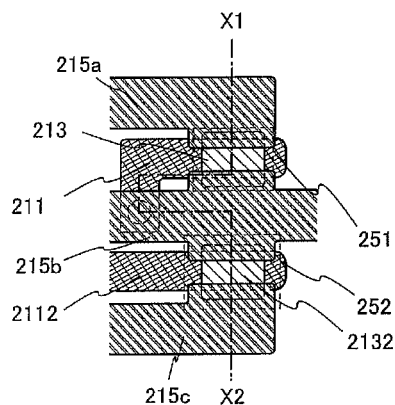
FIGS. 7A and 7B are an example of a structure including a plurality of transistors, which is applicable to a shift register which is one embodiment of the present invention in Embodiment 3.
Figure 7B:
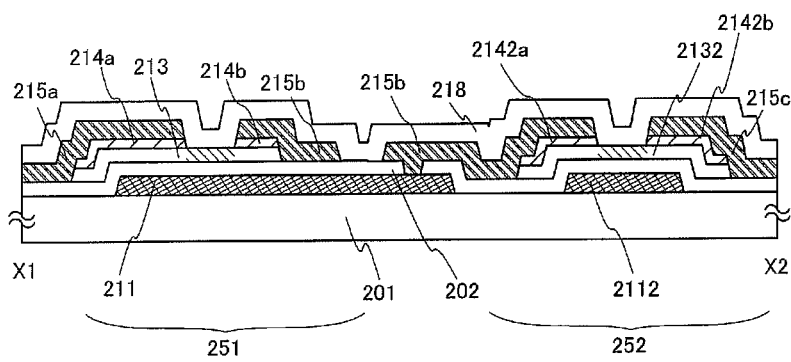

One embodiment in the case where a plurality of transistors in FIGS. 5A and 5C is used will be described with reference to FIGS. 7A and 7B. As an example, FIGS. 7A and 7B illustrate a structure of the plurality of transistors which are applicable to the shift register of one embodiment of the present invention. FIG. 7A is a top view and FIG. 7B is a cross-sectional view taken along line X1-X2 in FIG. 7A.

As an example, the transistor 251 and a transistor 252 are illustrated in FIGS. 7A and 7B. Note that as an example, a structure is illustrated in which an oxide conductive layer is provided between an oxide semiconductor layer and each of a source electrode and a drain electrode.

As in FIGS. 5A and 5C, the transistor 251 includes the gate electrode 211, the gate insulating layer 202, the oxide semiconductor layer 213, the oxide conductive layer 214a, the oxide conductive layer 214b, the conductive layer 215a, and the conductive layer 215b.

The gate electrode 211 is provided over the substrate 201 as illustrated in FIG. 7B, for example.

The gate insulating layer 202 is provided over the gate electrode 211.

The oxide semiconductor layer 213 is provided over the gate electrode 211 with the gate insulating layer 202 therebetween. The oxide semiconductor layer 213 is subjected to dehydration or dehydrogenation treatment.

The oxide conductive layer 214a and the oxide conductive layer 214b have conductivity higher than that of the oxide semiconductor layer 213 and function as a source region (also referred to as a low-resistance source region) and a drain region (also referred to as a low-resistance drain region) of the transistor 251.

The conductive layer 215a is provided over the oxide semiconductor layer 213 with the oxide conductive layer 214a therebetween and the conductive layer 215b is provided over the oxide semiconductor layer 213 with the oxide conductive layer 214b therebetween.

The transistor 252 includes a gate electrode 2112, the gate insulating layer 202, an oxide semiconductor layer 2132, an oxide conductive layer 2142a, an oxide conductive layer 2142b, the conductive layer 215b, and a conductive layer 215c.

The gate electrode 2112 is formed using the same layer as the gate electrode 211 and provided over the substrate 201 over which the gate electrode 211 is also provided.

The oxide semiconductor layer 2132 is formed using the same layer as the oxide semiconductor layer 213 and is subjected to dehydration or dehydrogenation treatment similarly to the oxide semiconductor layer 213 when formed.

The oxide conductive layer 2142a and the oxide conductive layer 2142b have conductivity higher than that of the oxide semiconductor layer 2132 and function as a source region (also referred to as a low-resistance source region) and a drain region (also referred to as a low-resistance drain region) of the transistor 252.

The transistors 251 and 252 in FIGS. 7A and 7B are provided with an oxide insulating layer 218 in contact with part of the oxide semiconductor layer 213 and part of the oxide semiconductor layer 2132, respectively, in addition to performing dehydration or dehydrogenation treatment on the oxide semiconductor layers.

Further, the gate electrode 211 of the transistor 251 is in contact with the conductive layer 215b in an opening portion formed in the gate insulating layer 202. Accordingly, favorable contact can be obtained, which leads to reduction in contact resistance. Thus, the number of openings can be reduced, which results in reducing the area occupied by openings. Therefore, a logic circuit (e.g., an inverter) which has this structure with the use of two transistors can be formed, for example.

As illustrated in FIGS. 7A and 7B, the shift register of one embodiment of the present invention includes a plurality of transistors, and a gate electrode of a transistor may be electrically connected to a source electrode or a drain electrode of another transistor in an opening portion formed in a gate insulating layer.

Next, an example of a method for manufacturing the transistor illustrated in FIGS. 5A and 5B is described with reference to FIGS. 8A to 8D. FIGS. 8A to 8D are cross-sectional views illustrating an example of a method for manufacturing the transistor illustrated in FIGS. 5A and 5B.

First, the substrate 201 is prepared. A conductive film is formed over the substrate 201, and then the gate electrode 211 is formed by a first photolithography step (see FIG. 8A). Note that side surfaces of the gate electrode 211 are preferably tapered. When the side surfaces of the gate electrode 211 are tapered, adhesion between the gate electrode 211 and a film formed on and in contact with the gate electrode 211 can be increased.

The substrate 201 needs to have an insulating surface and heat resistance high enough to withstand at least heat treatment to be performed later. As the substrate 201, a glass substrate or the like can be used, for example.

As the glass substrate, in the case where the temperature of the heat treatment to be performed later is high, the one whose strain point is 730° C. or higher is preferably used. As the glass substrate, a glass material such as aluminosilicate glass, aluminoborosilicate glass, or barium borosilicate glass is used. Note that by containing a larger amount of barium oxide (BaO) than boron oxide, more practical heat-resistant glass can be obtained. Therefore, a glass substrate containing BaO and B2O3 so that the amount of BaO is larger than that of $B_2O_3$ is preferably used.

Note that a substrate formed of an insulator, such as a ceramic substrate, a quartz substrate, or a sapphire substrate may be used for the substrate 201, instead of the glass substrate. Alternatively, a crystallized glass substrate or the like may be used.

An insulating film serving as a base film may be provided between the substrate 201 and the gate electrode 211. The base film has a function of preventing diffusion of an impurity element from the substrate 201 and can be formed to have a single-layer structure or a layered structure of one or more of a silicon nitride film, a silicon oxide film, a silicon nitride oxide film, and a silicon oxynitride film.

As an example of a material of the conductive film for forming the gate electrode 211, a metal material such as molybdenum, titanium, chromium, tantalum, tungsten, aluminum, copper, neodymium, or scandium or an alloy material containing any of these materials as a main component can be used. The conductive film for forming the gate electrode 211 can be formed with a single film containing one or more of these materials or a stacked film thereof.

As the conductive film for forming the gate electrode 211, for example, a stacked film of three layers in which a titanium film, an aluminum film, and a titanium film are stacked in this order, or a stacked film of three layers in which a molybdenum film, an aluminum film, and a molybdenum film are stacked in this order is preferably used. Needless to say, a single-layer film, a stacked film of two layers, or a stacked film of four or more layers may also be used as the conductive film. When a stacked conductive film of a titanium film, an aluminum film, and a titanium film is used as the conductive film, etching can be performed by a dry etching method with the use of a chlorine gas.

Next, the gate insulating layer 202 is formed over the gate electrode 211.

The gate insulating layer 202 can be formed to have a single layer of a silicon oxide layer, a silicon nitride layer, a silicon oxynitride layer, or a silicon nitride oxide layer or a stacked layer thereof by a plasma CVD method, a sputtering method, or the like. For example, when a silicon oxynitride layer is formed, a silicon oxynitride layer may be formed by a plasma CVD method with the use of $SiH_4$, oxygen, and nitrogen as a deposition gas. The thickness of the gate insulating layer 202 is greater than or equal to 100 nm and less than or equal to 500 nm; in the case where the gate insulating layer 202 is formed using a stacked layer, for example, a first gate insulating layer with a thickness of greater than or equal to 50 nm and less than or equal to 200 nm and a second gate insulating layer with a thickness of greater than or equal to 5 nm and less than or equal to 300 nm are stacked. When a silicon oxide film which is formed using a silicon target doped with phosphorus or boron is used for the gate insulating layer 202, entry of impurities (such as moisture, hydrogen ions, and $OH^-$) can be suppressed.

In this embodiment, the gate insulating layer 202 is formed using a silicon nitride film with a thickness of 200 nm by a plasma CVD method as an example.

Next, an oxide semiconductor film is formed over the gate insulating layer 202. The thickness of the oxide semiconductor film is preferably greater than or equal to 2 nm and less than or equal to 200 nm. For example, when the thickness of the oxide semiconductor film is as small as 50 nm or less, the oxide semiconductor film can be in an amorphous state even when heat treatment for dehydration or dehydrogenation is performed after formation of the oxide semiconductor film. By making the thickness of the oxide semiconductor film small, crystallization of the oxide semiconductor film can be suppressed when heat treatment is performed after the formation of the oxide semiconductor film.

Note that before the oxide semiconductor film is formed by a sputtering method, particles (also referred to as powdery substances or dust generated in film formation) which are attached on a surface of the gate insulating layer may be removed by reverse sputtering in which an argon gas is introduced and plasma is generated. The reverse sputtering refers to a method in which, without application of a voltage to a target side, an RF power source is used for application of a voltage to a substrate side in an argon atmosphere so that plasma is generated in the vicinity of the substrate to modify a surface. Note that instead of an argon atmosphere, a nitrogen atmosphere, a helium atmosphere, an oxygen atmosphere, or the like may be used.

As the oxide semiconductor film, any of the following can be used: an In—Ga—Zn—O-based oxide semiconductor film, an In—Sn—Zn—O-based oxide semiconductor film, an In—Al—Zn—O-based oxide semiconductor film, an Sn—Ga—Zn—O-based oxide semiconductor film, an Al—Ga—Zn—O-based oxide semiconductor film, an Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—Sn—O-based oxide semiconductor film, an In—O-based oxide semiconductor film, an Sn—O-based oxide semiconductor film, and a Zn—O-based oxide semiconductor film. In this embodiment, the oxide semiconductor film is formed using an In—Ga—Zn—O-based oxide semiconductor target by a sputtering method. Alternatively, the oxide semiconductor film can be formed by a sputtering method in a rare gas (typically, argon) atmosphere, an oxygen atmosphere, or a mixed atmosphere of a rare gas (typically, argon) and oxygen. In the case of employing a sputtering method, film deposition may be performed using a target containing $SiO_2$ at 2 wt % to 10 wt % inclusive and SiOx (x>0) which hinders crystallization may be contained in the oxide semiconductor film. Accordingly, crystallization of the oxide semiconductor layer to be formed later can be suppressed in heat treatment for dehydration or dehydrogenation which is to be performed later.

Here, the oxide semiconductor film is formed using an oxide semiconductor target for film deposition including In, Ga, and Zn (at a composition ratio of $In_2O_3:Ga_2O_3:ZnO=1:1:1$ [molar ratio]) under the following condition: the distance between the substrate and the target is 100 mm, the pressure is 0.6 Pa, the direct-current (DC) power supply is 0.5 kW, and the atmosphere is oxygen (the proportion of the oxygen flow is 100%). Note that a pulse direct-current (DC) power supply is preferable because powder substances generated at the time of film deposition can be reduced and the film thickness can be made uniform. In this embodiment, as the oxide semiconductor film, an In—Ga—Zn—O-based non-single-crystal film is formed by a sputtering method with the use of an In—Ga—Zn—O-based oxide semiconductor target for film deposition.

Examples of a sputtering method include an RF sputtering method in which a high frequency power source is used for a sputtering power source, a DC sputtering method in which a direct-current power source is used for a sputtering power source, and a pulsed DC sputtering method in which a bias is applied in a pulsed manner. An RF sputtering method is mainly used in the case where an insulating film is formed, and a DC sputtering method is mainly used in the case where a metal conductive film is formed.

Further, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Moreover, there are a sputtering apparatus provided with a magnet system inside a chamber and used for a magnetron sputtering method, and a sputtering apparatus used for an ECR sputtering method in which plasma generated with the use of microwaves is used without using glow discharge.

As a film deposition method employing a sputtering method, there are a reactive sputtering method in which a target substance and a sputtering gas component are chemically reacted with each other during film formation to form a thin film of a compound thereof, and a bias sputtering method in which voltage is also applied to a substrate during film deposition.

As an evacuation means of the deposition chamber where sputtering is performed, a cryopump is preferably used. When the cryopump is used for evacuation, impurities such as moisture in the deposition chamber can be removed.

Figure 8A:
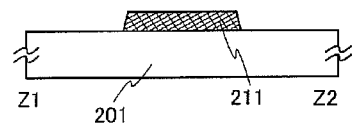
FIGS. 8A to 8D are an example of a method for manufacturing the transistor illustrated in FIGS. 5A and 5B.
Figure 8B:
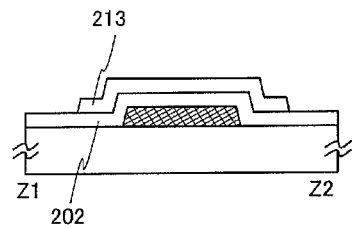
Figure 8C:
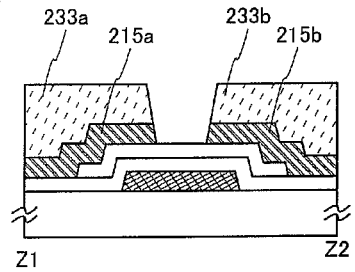
Figure 8D:
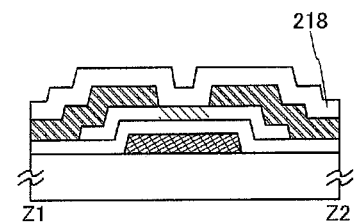

Next, the oxide semiconductor film is processed into an island shape by a second photolithography step to form the oxide semiconductor layer 213 (see FIG. 8B). Note that after the second photolithography step, the oxide semiconductor layer 213 may be subjected to heat treatment (at higher than or equal to 400° C. and lower than 750° C.) in an inert gas atmosphere (e.g., nitrogen, helium, neon, or argon) so that impurities such as hydrogen and water contained in the layer are removed.

Next, the oxide semiconductor layer is dehydrated or dehydrogenated. First heat treatment for dehydration or dehydrogenation is performed at a temperature higher than or equal to 400° C. and lower than 750° C., preferably higher than or equal to 425° C. and lower than 750° C. Note that in the case of the temperature that is 425° C. or higher, the heat treatment time may be one hour or shorter, whereas in the case of the temperature lower than 425° C., the heat treatment time is longer than one hour. In this embodiment, the substrate is introduced into an electric furnace, which is one of heat treatment apparatuses, and heat treatment is performed on the oxide semiconductor layer in a nitrogen atmosphere. Then, the oxide semiconductor layer is not exposed to air, which prevents entry of water and hydrogen into the oxide semiconductor layer again, so that the oxide semiconductor layer is obtained. In this embodiment, slow cooling is performed from the heating temperature T at which the oxide semiconductor layer is subjected to dehydration or dehydrogenation to a temperature low enough to prevent water from entering again, specifically to a temperature that is lower than the heating temperature T by 100° C. or more, in a nitrogen atmosphere and in one furnace. The atmosphere is not limited to a nitrogen atmosphere, and dehydration or dehydrogenation may be performed in an inert gas atmosphere such as helium, neon, or argon.

Note that the heat treatment apparatus is not limited to an electric furnace, and may have a device for heating an object by heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment with a high-temperature gas. As the gas, an inert gas which hardly reacts with an object to be processed by heat treatment is used. For example, nitrogen or a rare gas such as argon is used.

When the oxide semiconductor layer is subjected to heat treatment at a temperature of higher than or equal to 400° C. and lower than 750° C., the dehydration or dehydrogenation of the oxide semiconductor layer can be achieved; thus, water ($H_2O$) can be prevented from being contained again in the oxide semiconductor layer later.

Note that it is preferable that in the first heat treatment, water, hydrogen, and the like be not contained in nitrogen or a rare gas such as helium, neon, or argon. In the first heat treatment, the purity of nitrogen or a rare gas such as helium, neon, or argon which is introduced into the heat treatment apparatus is preferably greater than or equal to 6N (99.9999%), more preferably greater than or equal to 7N (99.99999%) (i.e., the impurity concentration is preferably less than or equal to 1 ppm, more preferably less than or equal to 0.1 ppm).

The oxide semiconductor layer becomes a microcrystalline layer, a nanocrystalline layer, or a polycrystalline layer by crystallization in some cases, depending on conditions of the first heat treatment or a material of the oxide semiconductor layer. For example, the oxide semiconductor layer may crystallize to become a microcrystalline semiconductor layer having a crystallinity of 90% or more, or 80% or more. Further, depending on conditions of the first heat treatment or a material of the oxide semiconductor layer, the oxide semiconductor layer may become an amorphous oxide semiconductor layer containing no crystalline component.

The oxide semiconductor layers are changed into oxygen-deficient and low-resistance oxide semiconductor layers, i.e., n-type low-resistance oxide semiconductor layers, after the first heat treatment. The oxide semiconductor layer after the first heat treatment has a higher carrier concentration than the oxide semiconductor layer shortly after the formation and preferably has a carrier concentration of $1 \times 10^{18}/cm^3$ or more.

The first heat treatment can be performed on the oxide semiconductor film which has not been processed into the island-shaped oxide semiconductor layer. In that case, the substrate is taken out of the heat treatment apparatus after the first heat treatment, and then a photolithography step is performed.

Next, a conductive film for forming the source electrode and the drain electrode of the transistor is formed over the gate insulating layer 202 and the oxide semiconductor layer 213.

For the conductive film, an element selected from Ti, Mo, W, Al, Cr, Cu, and Ta, an alloy containing any of these elements as a component, an alloy containing these elements in combination, or the like is used. The conductive film is not limited to a single layer including the above element and can be formed in a stacked layer of two or more layers. In this embodiment, a three-layer conductive film in which a titanium film (with a thickness of 100 nm), an aluminum film (with a thickness of 200 nm), and a titanium film (with a thickness of 100 nm) are stacked is formed. Instead of a Ti film, a titanium nitride film may be used.

In the case where heat treatment at 200° C. to 600° C. is performed, it is preferable that the conductive film have heat resistance high enough to withstand the heat treatment. For example, it is preferable to use an aluminum alloy to which an element which prevents hillocks is added or a conductive film stacked with a heat-resistance conductive film. As the formation method of the conductive film, a sputtering method, a vacuum evaporation method (e.g., an electron beam evaporation method), an arc discharge ion plating method, or a spray method is used. Alternatively, the conductive film may be formed by discharging a conductive nanopaste of silver, gold, copper, or the like by a screen printing method, an ink jet method, or the like and baking the nanopaste.

Next, a third photolithography step is performed. A resist mask 233a and a resist mask 233b are formed over the conductive film for forming the source electrode and the drain electrode, and part of the conductive film is selectively etched with the use of the resist mask 233a and the resist mask 233b, so that the conductive layer 215a and the conductive layer 215b are formed (see FIG. 8C).

In the third photolithography step, only part of the conductive film which are on and in contact with the oxide semiconductor layer is selectively removed. For example, when an ammonia peroxide mixture (hydrogen peroxide:ammonia: water=5:2:2 in a weight ratio) or the like is used as an alkaline etchant in order to selectively remove only part of the metal conductive film, which is on and in contact with the In—Ga—Zn—O-based oxide semiconductor layer, the metal conductive film can be selectively removed, and the oxide semiconductor layer formed of an oxide semiconductor can be left.

In the third photolithography step, an exposed region of the oxide semiconductor layer is etched in some cases depending on an etching condition. In that case, a region of the oxide semiconductor layer, which is sandwiched between the source electrode and the drain electrode (a region sandwiched between the conductive layer 215a and the conductive layer 215b) is thinner than a region of the oxide semiconductor layer, which overlaps with the source electrode or the drain electrode over the gate electrode 211.

Next, the oxide insulating layer 218 is formed over the gate insulating layer 202 and the oxide semiconductor layer 213. At this stage, part of the oxide semiconductor layer 213 is in contact with the oxide insulating layer 218. Note that a region of the oxide semiconductor layer, which overlaps with the gate electrode with the gate insulating layer therebetween, is a channel formation region.

The oxide insulating layer 218 can be formed to have a thickness of 1 nm or more by a method with which impurities such as water and hydrogen are not mixed into the oxide insulating layer, such as a sputtering method, as appropriate. In this embodiment, a silicon oxide film is formed as the oxide insulating layer by a sputtering method. The substrate temperature in deposition may be higher than or equal to room temperature and lower than or equal to 300° C. The substrate temperature is 100° C. in this embodiment. The silicon oxide film can be formed by a sputtering method in a rare gas (typically argon) atmosphere, an oxygen atmosphere, or an atmosphere containing a rare gas (typically argon) and oxygen. Moreover, a silicon oxide target or a silicon target can be used as a target. For example, with the use of a silicon target, a silicon oxide film can be formed by a sputtering method in an atmosphere containing oxygen and a rare gas. The oxide insulating layer which is formed in contact with the oxide semiconductor layer 213 whose resistance is reduced is formed using an inorganic insulating film which does not contain impurities such as moisture, hydrogen ions, and OH$^-$ and blocks entry of such impurities from the outside; a silicon oxide film, a silicon nitride oxide film, an aluminum oxide film, an aluminum oxynitride film, or the like is typically used. Note that an oxide insulating layer formed by a sputtering method is particularly dense, and even a single layer can be used as a protective film for suppressing a phenomenon in which impurities are diffused into a layer in contact therewith. Further, a target doped with phosphorus (P) or boron (B) can be used so that phosphorus (P) or boron (B) is added to the oxide insulating layer.

In this embodiment, the film deposition is performed by a pulsed DC sputtering method using a columnar polycrystalline, boron-doped silicon target which has a purity of 6N (the resistance value is 0.01 Ω·cm), in which the distance between the substrate and the target (T-S distance) is 89 mm, the pressure is 0.4 Pa, the direct-current (DC) power source is 6 kW, and the atmosphere is oxygen (the proportion of the oxygen flow is 100%). The film thickness is 300 nm.

The oxide insulating layer 218 is provided on and in contact with the channel formation region of the oxide semiconductor layer and also functions as a channel protective layer.

Next, second heat treatment (preferably at higher than or equal to 200° C. and lower than or equal to 400° C., for example, at higher than or equal to 250° C. and lower than or equal to 350° C.) may be performed in an inert gas atmosphere (e.g., a nitrogen atmosphere). For example, the second heat treatment is performed in a nitrogen atmosphere at 250° C. for one hour. When the second heat treatment is performed, the oxide semiconductor layer 213 is heated while part thereof is in contact with the oxide insulating layer 218 and other parts thereof are in contact with the conductive layer 215a and the conductive layer 215b.

When the second heat treatment is performed while the oxide semiconductor layer 213 whose resistance is reduced in the first heat treatment is in contact with the oxide insulating layer 218, the region in contact with the oxide insulating layer 218 becomes in an oxygen-excess state. Accordingly, the region of the oxide semiconductor layer 213, which is in contact with the oxide insulating layer 218, becomes an i-type (increases resistance) in a depth direction of the oxide semiconductor layer 213 (see FIG. 8D).

The timing of performing the second heat treatment is not limited to the timing shortly after the third photolithography step as long as it is after the third photolithography step.

Thus, the transistor of this embodiment can be manufactured.

Note that this embodiment can be combined as appropriate with any of the other embodiments.

Embodiment 4

In this embodiment, another example of a transistor which is applicable to a shift register of one embodiment of the present invention will be described.

Figure 9A:
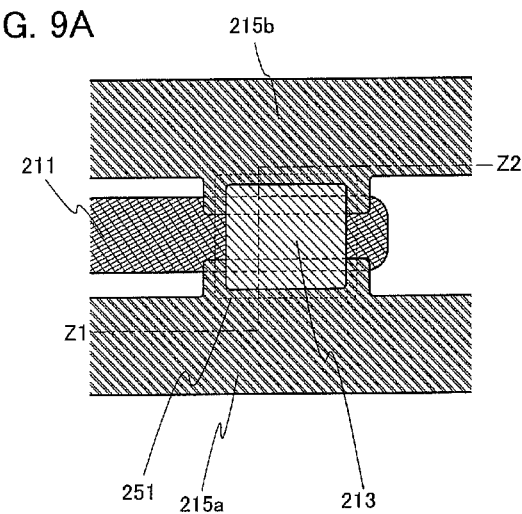
FIGS. 9A and 9B are another example of a structure of a transistor which is applicable to a shift register which is one embodiment of the present invention in Embodiment 4.
Figure 9B:
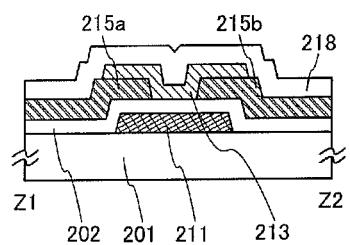

An example of a structure of the transistor of this embodiment will be described with reference to FIGS. 9A and 9B. FIGS. 9A and 9B illustrate an example of a structure of the transistor of this embodiment. FIG. 9A is a top view and FIG. 9B is a cross-sectional view taken along line Z1-Z2 in FIG. 9A.

As in the transistors in FIGS. 5A to 5C, the transistor in FIGS. 9A and 9B includes the gate electrode 211, the gate insulating layer 202, the oxide semiconductor layer 213, the conductive layer 215a, and the conductive layer 215b.

The gate electrode 211 is provided over the substrate 201 as illustrated in FIG. 9B, for example.

The gate insulating layer 202 is formed over the gate electrode 211.

The conductive layer 215a and the conductive layer 215b are each provided over part of the gate insulating layer 202.

The oxide semiconductor layer 213 is provided over the gate electrode 211, the conductive layer 215a, and the conductive layer 215b with the gate insulating layer 202 therebetween. The oxide semiconductor layer 213 is subjected to dehydration or dehydrogenation treatment when formed.

Further, as for the transistor in FIGS. 9A and 9B, the oxide semiconductor layer is subjected to dehydration or dehydrogenation treatment, and moreover, the oxide insulating layer 218 is formed in contact with part of the oxide semiconductor layer 213.

Note that a nitride insulating layer may be provided over the oxide insulating layer 218. It is preferable that the nitride insulating layer be in contact with the gate insulating layer 202 provided below the oxide insulating layer 218 or an insulating layer serving as a base, so that impurities such as moisture, hydrogen ions, and OH$^-$ from the vicinity of side surfaces of the substrate are prevented from entering. In particular, it is effective to use a silicon nitride layer for the gate insulating layer 202 in contact with the oxide insulating layer 218 or the insulating layer serving as a base. That is, when the silicon nitride layers are provided so as to surround a lower surface, an upper surface, and side surfaces of the oxide semiconductor layer 213, reliability of the display device is improved.

Further, a planarization insulating layer may be provided over the oxide insulating layer 218 (over the nitride insulating layer in the case where the nitride insulating layer is provided).

As in FIGS. 6A and 6B, the transistor 251 in FIGS. 9A and 9B may have a structure in which a conductive layer is provided over the oxide insulating layer 218 (over the planarization insulating layer in the case where the planarization insulating layer is provided) so that the oxide insulating layer 218 is sandwiched between the conductive layer and the oxide semiconductor layer 213. The conductive layer serves as a second gate electrode. Second gate voltage is applied to the conductive layer, whereby the threshold voltage of the transistor 251 can be controlled.

Note that the planarization insulating layer is not necessarily provided. When the planarization insulating layer is not provided, a conductive layer serving as a second gate electrode can be formed over the oxide insulating layer 218 (over the nitride insulating layer in the case where the nitride insulating layer is formed).

For example, when a voltage which is higher than or equal to the voltage of the source electrode is applied to the conductive layer serving as a second gate electrode, the threshold voltage of the transistor shifts in a negative direction. When a voltage which is lower than the voltage of the source electrode is applied to the conductive layer serving as a second gate electrode, the threshold voltage of the transistor shifts in a positive direction.

Alternatively, the transistor of this embodiment can have a structure in which the oxide conductive layer 214a is provided between the oxide semiconductor layer 213 and the conductive layer 215a and the oxide conductive layer 214b is provided between the oxide semiconductor layer 213 and the conductive layer 215b, as in the transistor 251 in FIG. 5C.

As illustrated in FIGS. 9A and 9B, the transistor of this embodiment is a so-called bottom-contact transistor in which an oxide semiconductor layer is provided over a source electrode or a drain electrode. Therefore, high-speed operation can be performed since the transistor of this embodiment has higher mobility than that of the conventional transistor which includes amorphous silicon for a channel formation layer. Further, even when the transistor of this embodiment is used, power consumption of the shift register of one embodiment of the present invention can be reduced. Furthermore, the bottom-contact transistor is applied, so that an area where the oxide semiconductor layer is in contact with the conductive layer serving as the source electrode or the drain electrode can be increased and peeling or the like can be prevented.

Embodiment 5

In this embodiment, another example of a transistor which is applicable to a shift register of one embodiment of the present invention will be described.

Figure 10A:
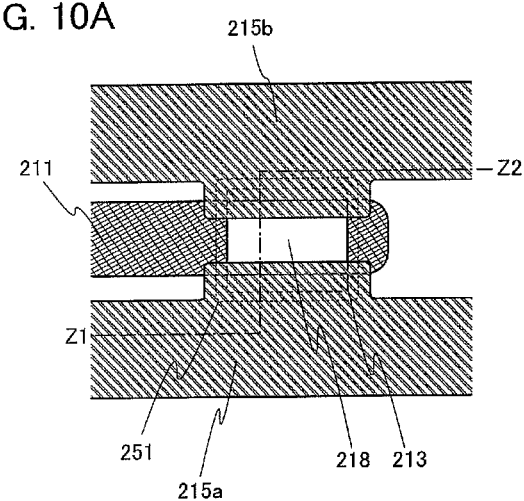
FIGS. 10A and 10B are another example of a structure of a transistor which is applicable to a shift register which is one embodiment of the present invention in Embodiment 5.
Figure 10B:
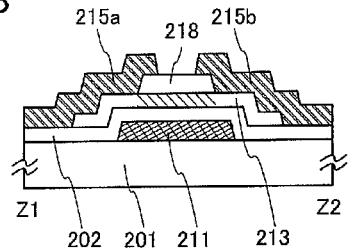

The example of the structure of the transistor of this embodiment will be described with reference to FIGS. 10A and 10B. FIGS. 10A and 10B illustrate an example of the structure of the transistor in this embodiment. FIG. 10A is a top view and FIG. 10B is a cross-sectional view taken along line Z1-Z2 in FIG. 10A.

As in the transistors illustrated in FIGS. 5A to 5C, FIGS. 6A and 6B, and FIGS. 9A and 9B, the transistor in FIGS. 10A and 10B includes the gate electrode 211, the gate insulating layer 202, the oxide semiconductor layer 213, the conductive layer 215a, and the conductive layer 215b.

The gate electrode 211 is provided over the substrate 201 as illustrated in FIG. 10B, for example.

The gate insulating layer 202 is provided over the gate electrode 211.

The oxide semiconductor layer 213 is provided over the gate electrode 211 with the gate insulating layer 202 therebetween. Further, the oxide semiconductor layer 213 is subjected to dehydration or dehydrogenation treatment when formed.

Further, as for the transistor in FIGS. 10A and 10B, the oxide semiconductor layer is subjected to dehydration or dehydrogenation treatment, and moreover, the oxide insulating layer 218 is provided in contact with part of the oxide semiconductor layer 213. The oxide insulating layer 218 in FIGS. 10A and 10B serves as a channel protective layer.

The conductive layer 215a and the conductive layer 215b are each provided over parts of the oxide semiconductor layer 213 and the oxide insulating layer 218. Each of the conductive layer 215a and the conductive layer 215b serves as a source electrode or a drain electrode.

Note that a nitride insulating layer may be provided over the oxide insulating layer 218. It is preferable that the nitride insulating layer be in contact with the gate insulating layer 202 provided below the oxide insulating layer 218 or an insulating layer serving as a base, so that impurities such as moisture, hydrogen ions, and $OH^-$ from the vicinity of side surfaces of the substrate are prevented from entering. In particular, it is effective to use a silicon nitride layer for the gate insulating layer 202 in contact with the oxide insulating layer 218 or the insulating layer serving as a base. That is, when the silicon nitride layers are provided so as to surround a lower surface, an upper surface, and side surfaces of the oxide semiconductor layer 213, reliability of the display device is improved.

Further, a planarization insulating layer may be provided over the oxide insulating layer 218 (over the nitride insulating layer in the case where the nitride insulating layer is provided).

Further, a conductive layer may be provided over the oxide insulating layer 218 (over the planarization insulating layer in the case where the planarization insulating layer is provided) so that the oxide insulating layer 218 is sandwiched between the conductive layer and the oxide semiconductor layer 213. The conductive layer serves as a second gate electrode. Second gate voltage is applied to the conductive layer, whereby the threshold voltage of the transistor 251 can be controlled.

Note that the planarization insulating layer is not necessarily provided. When the planarization insulating layer is not provided, a conductive layer serving as a second gate electrode can be formed over the oxide insulating layer 218 (over the nitride insulating layer in the case where the nitride insulating layer is formed).

For example, when a voltage which is higher than or equal to the voltage of the source electrode is applied to the conductive layer serving as a second gate electrode, the threshold voltage of the transistor shifts in a negative direction. When a voltage which is lower than the voltage of the source electrode is applied to the conductive layer serving as a second gate electrode, the threshold voltage of the transistor shifts in a positive direction.

Further, as in the transistor 251 in FIG. 5C, a transistor of this embodiment may have a structure in which a pair of oxide conductive layers serving as buffer layers is provided over parts of the oxide semiconductor layer 213 of the transistor, and a pair of electrodes of the conductive layer 215a and the conductive layer 215b is provided so as to be in contact with the pair of the oxide conductive layers.

As described above, the transistor of this embodiment is a so-called channel protective transistor including an insulating layer serving as a channel protective layer formed over part of an oxide semiconductor layer. Therefore, high-speed operation can be performed since the transistor of this embodiment has higher mobility than that of the conventional transistor which includes amorphous silicon for a channel formation layer. Further, even when the transistor of this embodiment is used, power consumption of the shift register of one embodiment of the present invention can be reduced.

Note that this embodiment can be combined as appropriate with any of the other embodiments.

Embodiment 6

In this embodiment, a display device in which the shift register, which is one embodiment of the present invention, is used in a driver circuit will be described. Note that in this embodiment, as an example, a display device including at least part of a driver circuit and a pixel portion including pixel whose display state is controlled by the driver circuit over one substrate will be described.

Figure 11A:
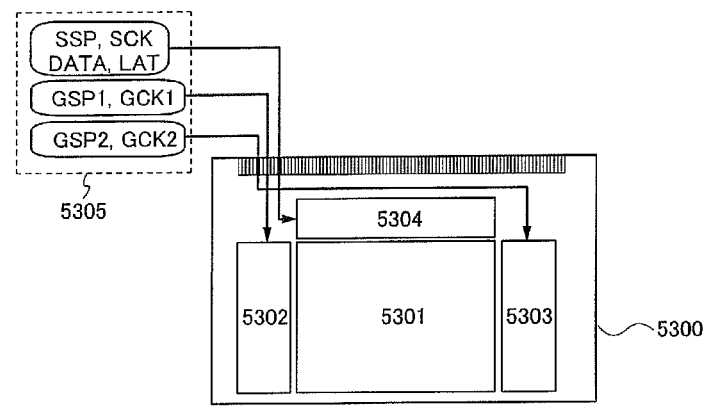
FIGS. 11A and 11B each illustrate a block diagram of a display device in Embodiment 6.

FIG. 11A illustrates an example of a block diagram of an active matrix display device. The display device includes a pixel portion 5301, a first scan line driver circuit 5302, a second scan line driver circuit 5303, and a signal line driver circuit 5304 over a substrate 5300. In the pixel portion 5301, a plurality of signal lines which are extended from the signal line driver circuit 5304 and a plurality of scan lines which are extended from the first scan line driver circuit 5302 and the second scan line driver circuit 5303 are provided. Note that pixels which include display elements are arranged in matrix in regions where the scan lines and the signal lines are crossed. In addition, the substrate 5300 of the display device is connected to a timing control circuit 5305 (also referred to as a controller or a control IC) through a connection portion such as a flexible printed circuit (FPC).

In FIG. 11A, the first scan line driver circuit 5302, the second scan line driver circuit 5303, and the signal line driver circuit 5304 are formed over the same substrate 5300 as the pixel portion 5301. Therefore, the number of components of a driver circuit which is provided outside and the like is reduced, which leads to cost reduction. Further, in the case where a driver circuit is provided outside the substrate 5300, a wiring need to be extended and the number of connections of wirings is increased. On the other hand, in the case where a driver circuit is provided over the substrate 5300, the number of connection of wirings can be reduced, which leads to improvement in reliability or improvement in a yield.

The timing control circuit 5305 supplies, for example, a first scan line driver circuit start signal (GSP1) and a first scan line driver circuit clock signal (GCK1) to the first scan line driver circuit 5302. The timing control circuit 5305 supplies, for example, a second scan line driver circuit start signal (GSP2) and a second scan line driver circuit clock signal (GCK2) to the second scan line driver circuit 5303. The timing control circuit 5305 supplies, for example, a signal line driver circuit start signal (SSP), a signal line driver circuit clock signal (SCK), video signal data (DATA, also simply referred to as a video signal), and a latch signal (LAT) to the signal line driver circuit 5304. Note that each clock signal may be a plurality of clock signals whose phases are shifted or may be supplied together with an inverted clock signal (CKB) which is obtained by inverting the clock signal. Note that one of the first scan line driver circuit 5302 and the second scan line driver circuit 5303 can be eliminated.

Figure 11B:
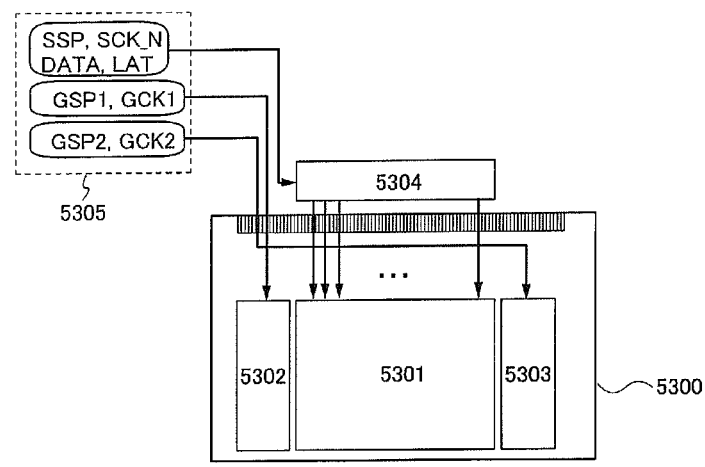

FIG. 11B illustrates a structure in which the first scan line driver circuit 5302 and the second scan line driver circuit 5303 are formed over the same substrate 5300 as the pixel portion 5301 and the signal line driver circuit 5304 is formed over a substrate which is different from the pixel portion 5301. With such a structure, increase in size of the display device, reduction in the number of manufacturing steps, reduction in cost, improvement in yield, or the like can be achieved.

Figure 12A:
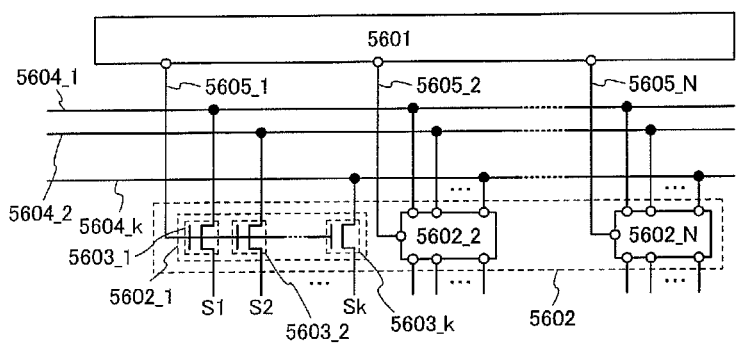
FIGS. 12A and 12B are a view and a timing chart illustrating a structure of a signal line driver circuit in Embodiment 6.
Figure 12B:
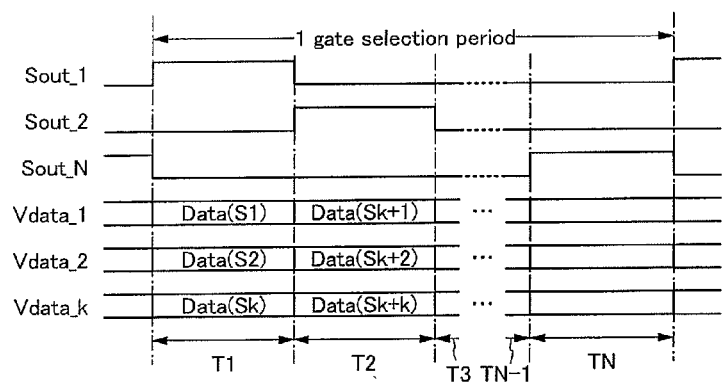

FIGS. 12A and 12B illustrate an example of a structure and operation of a signal line driver circuit which is formed using n-channel TFTs.

The signal line driver circuit includes a shift register 5601 and a switching circuit 5602. The switching circuit 5602 includes a plurality of switching circuits 5602_1 to 5602_N (N is a natural number of greater than or equal to 2). The switching circuits 5602_1 to 5602_N each include a plurality of thin film transistors 5603_1 to 5603_*k* (k is a natural number of greater than or equal to 2). An example where the thin film transistors 5603_1 to 5603_*k* are n-channel TFTs is described.

A connection relation in the signal line driver circuit is described taking the switching circuit 5602_1 as an example. One of a source and a drain of each of the thin film transistors 5603_1 to 5603_*k* is electrically connected to one of wirings 56041 to 5604_*k*. The other of the source and the drain of each of the thin film transistors 5603_1 to 5603_*k* is electrically connected to one of signal lines S1 to Sk. Gates of the thin film transistors 5603_1 to 5603_*k* are electrically connected to a wiring 5605_1.

The shift register 5601 has a function of sequentially outputting high level signals to the wirings 5605_1 to 5605_N and sequentially selecting the switching circuits 5602_1 to 5602_N.

The switching circuit 5602_1 has a function of controlling a conduction state between the wirings 5604_1 to 5604_*k* and the signal lines S1 to Sk, that is, a function of controlling whether voltages of the wirings 5604_1 to 5604_*k* are supplied to the signal lines S1 to Sk. In this manner, the switching circuit 5602_1 functions as a selector. Further, the thin film transistors 5603_1 to 5603_*k* each have functions of controlling conduction states between the wirings 5604_1 to 5604_*k* and the signal lines S1 to Sk, that is, functions of supplying the voltages of the wirings 5604_1 to 5604_*k* to the signal lines S1 to Sk. In this manner, each of the thin film transistors 5603_1 to 5603_*k* functions as a switch.

Note that video signal data (DATA) is input to each of the wirings 5604_1 to 5604_*k*. The video signal data (DATA) is an analog signal corresponding to an image signal or image data in many cases.

Next, operation of the signal line driver circuit in FIG. 12A is described with reference to a timing chart in FIG. 12B. FIG. 12B illustrates examples of signals Sout_1 to Sout_N and signals Vdata_1 to Vdata_k. The signals Sout_1 to Sout_N are examples of output signals from the shift register 5601, and the signals Vdata_1 to Vdata_k are examples of signals input to the wirings 5604_1 to 5604_*k*. Note that one operation period of the signal line driver circuit corresponds to one gate selection period in a display device. For example, one gate selection period is divided into periods T1 to TN. Each of the periods T1 to TN is a period during which the video signal data (DATA) is written to pixels in a selected row.

In the periods T1 to TN, the shift register 5601 sequentially outputs H-level signals to the wirings 5605_1 to 5605_N. For example, in the period T1, the shift register 5601 outputs the high level signal to the wiring 5605_1. Then, the thin film transistors 5603_1 to 5603_*k* are turned on, so that the wirings 5604_1 to 5604_*k* and the signal lines S1 to Sk are brought into conduction. In this case, Data (S1) to Data (Sk) are input to the wirings 5604_1 to 5604_*k*, respectively. The Data (S1) to Data (Sk) are input to pixels in a selected row in first to k-th columns through the thin film transistors 5603_1 to 5603_k, respectively. Thus, in the periods T1 to TN, video signal data (DATA) is sequentially written to the pixels in the selected row by k columns.

By writing video signal data (DATA) to pixels by a plurality of columns as described above, the number of video signal data (DATA) or the number of wirings can be reduced. Accordingly, the number of connections to an external circuit can be reduced. By writing video signals to pixels by a plurality of columns, writing time can be extended and insufficient writing of video signals can be prevented.

Note that as the shift register 5601, the shift register of one embodiment of the present invention can be used, and as the shift register 5601 and the switching circuit 5602, a circuit including the thin film transistors described in any of Embodiments 3 to 5 can be used. In that case, the shift register 5601 can be constituted by only n-channel transistors or only p-channel transistors.

Further, an example of a shift register used for part of the scan line driver circuit and part of the signal line driver circuit, or a shift register used for part of the scan line driver circuit or part of the signal line driver circuit will be described.

The scan line driver circuit includes a shift register. The scan line driver circuit may also include a level shifter, a buffer, or the like in some cases. In the scan line driver circuit, a clock signal (CLK) and a start pulse signal (SP) are input to the shift register, and then a selection signal is generated. The generated selection signal is buffered and amplified in the buffer, and the resulting signal is supplied to a corresponding scan line. Gates of transistors in pixels of one line are electrically connected to a scan line. Since the transistors in the pixels of one line must be turned on all at once, a buffer which can supply a large amount of current is used.

Further, one embodiment of a shift register is used for part of the scan line driver circuit and part of the signal line driver circuit, or a shift register used for part of the scan line driver circuit or part of the signal line driver circuit will be described with reference to FIGS. 13A to 13C and FIGS. 14A and 14B.

Figure 13A:
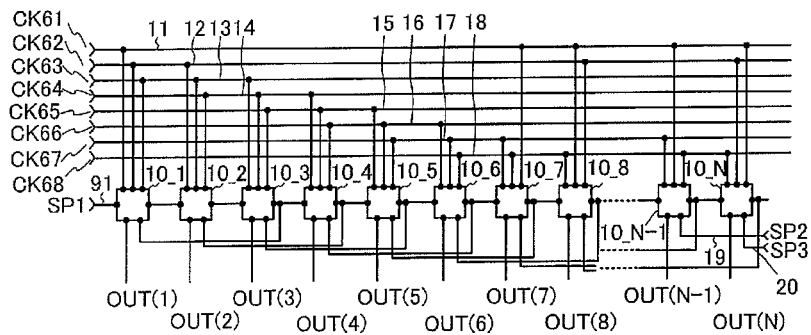
FIGS. 13A to 13C are circuit diagrams illustrating a structure of a shift register in Embodiment 6.

The shift register includes first to N-th flip-flops 10_1 to 10_N (N is a natural number greater than or equal to 3) (see FIG. 13A). In the shift register in FIG. 13A, to the first to N-th flip-flops 10_1 to 10_N, a clock signal CK61, a clock signal CK62, a clock signal CK63, a clock signal CK64, a clock signal CK65, a clock signal CK66, a clock signal CK67, and a clock signal CK68 are supplied from a wiring 11, a wiring 12, a wiring 13, a wiring 14, a wiring 15, a wiring 16, a wiring 17, and a wiring 18, respectively. A start pulse SP1 (a first start pulse) from a wiring 91 is input to the first flip-flop 10_1. Further, to the n-th flip-flop 10_n (n is a natural number of greater than or equal to 2 and less than or equal to N) of the second or one of its subsequent stages, a signal from the flip-flop of the preceding stage (a preceding-stage signal OUT(n−1)) is input. Further, a signal from the third flip-flop 10_3 in the two stages after the first flip-flop 10_1 is input to the first flip-flop 10_1, and a signal from the (n+2)-th flip-flop 10_(n+2) in the two stages after the n-th flip-flop 10_n (such a signal is referred to as a latter-stage signal OUT(n+2)) is input to the n-th flip-flop 10_n in the second or one of its subsequent stages. Therefore, the flip-flops of the respective stages output first output signals OUT(1)(SR) to OUT(N)(SR) to be input to the flip-flop in the subsequent stage and in two stages prior stages and second output signals OUT(1) to OUT(N) to be input to another circuit or the like. Since the latter-stage signal OUT(n+2) is not input to the last two stages of the shift register, a structure in which a second start pulse SP2 and a third start pulse SP3 are input from a wiring 19 and a wiring 20, respectively, may be employed, for example, as illustrated in FIG. 13A. Alternatively, another signal generated in the shift register may be used. For example, an (n+1)-th flip-flop 10_(n+1) and an (n+2)-th flip-flop 10_(n+2) (such flip-flops are referred to as dummy stages) both of which do not contribute to pulse output to a pixel portion may be provided and the dummy stages may generate signals corresponding to the second start pulse (SP2) and the third start pulse (SP3).

Note that the clock signal CK61, the clock signal CK62, the clock signal CK63, the clock signal CK64, the cock signal CK65, the clock signal CK66, the clock signal CK 67, and the clock signal CK 68 are clock signals whose duty ratio is 25% and are eight-phase clock signals which are sequentially delayed by ¼ cycle. As compared to the four-phase clock signals in Embodiment 1, the clock signal CK61, the clock signal CK63, the clock signal CK65, and the clock signal CK67 correspond to the clock signal CK1, the clock signal CK2, the clock signal CK3, and the clock signal CK4 in Embodiment 1, respectively. Thus, part of a period in which a signal is at high level overlaps with part of a period in which at least another signal is at high level, whereby the shift register can operate at higher speed. In this case, the structure can be used in which at least the clock signal CK61 is input to the first flip-flop 10_1, at least the clock signal CK 62 is input to the second flip-flop 10_2, at least the clock signal CK63 is input to the third flip-flop 10_3, at least the clock signal CK64 is input to the fourth flip-flop 10_4, at least the clock signal CK65 is input to the fifth flip-flop 10_5, at least the clock signal CK66 is input to the sixth flip-flop 10_6, at least the clock signal CK67 is input to the seventh flip-flop 10_7, and at least the clock signal CK68 is input to the eighth flip-flop 10_8. In this embodiment, control of operation of the flip-flops or the like is performed using the clock signals CK61 to CK68. Note that the clock signal is also referred to as GCK or SCK in some cases depending on a driver circuit to which the clock signal is input; the clock signal is referred to as CK in the following description.

Figure 13B:
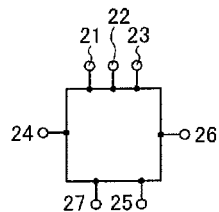

In addition, each of the first to N-th flip-flops 10_1 to 10_N includes a first input terminal 21, a second input terminal 22, a third input terminal 23, a fourth input terminal 24, a fifth input terminal 25, a first output terminal 26, and a second output terminal 27 (see FIG. 13B). The first input terminal 21, the second input terminal 22, and the third input terminal 23 are electrically connected to any of the wirings 11 to 18. For example, in FIG. 13A, the first input terminal 21 of the first flip-flop 10_1 is electrically connected to the wiring 11, the second input terminal 22 of the first flip-flop 10_1 is electrically connected to the wiring 12, and the third input terminal 23 of the first flip-flop 10_1 is electrically connected to the wiring 13. The first input terminal 21 of the second flip-flop 10_2 is electrically connected to the wiring 12, the second input terminal 22 of the second flip-flop 10_2 is electrically connected to the wiring 13, and the third input terminal 23 of the second flip-flop 10_2 is electrically connected to the wiring 14. The first input terminal 21 of the third flip-flop 10_3 is electrically connected to the wiring 13, the second input terminal 22 of the third flip-flop 10_3 is electrically connected to the wiring 14, and the third input terminal 23 of the third flip-flop 10_3 is electrically connected to the wiring 15. The first input terminal 21 of the fourth flip-flop 10_4 is electrically connected to the wiring 14, the second input terminal 22 of the fourth flip-flop 10_4 is electrically connected to the wiring 15, and the third input terminal 23 of the fourth flip-flop 10_4 is electrically connected to the wiring 16. The first input terminal 21 of the fifth flip-flop 10_5 is electrically connected to the wiring 15, the second input terminal 22 of the fifth flip-flop 10_5 is electrically connected to the wiring 16, and the third input terminal 23 of the fifth flip-flop 10_5 is electrically connected to the wiring 17. The first input terminal 21 of the sixth flip-flop 10_6 is electrically connected to the wiring 16, the second input terminal 22 of the sixth flip-flop 10_6 is electrically connected to the wiring 17, and the third input terminal 23 of the sixth flip-flop 10_6 is electrically connected to the wiring 18. The first input terminal 21 of the seventh flip-flop 10_7 is electrically connected to the wiring 17, the second input terminal 22 of the seventh flip-flop 10_7 is electrically connected to the wiring 18, and the third input terminal 23 of the seventh flip-flop 10_7 is electrically connected to the wiring 11. The first input terminal 21 of the eighth flip-flop 10_8 is electrically connected to the wiring 18, the second input terminal 22 of the eighth flip-flop 10_8 is electrically connected to the wiring 11, and the third input terminal 23 of the eighth flip-flop 10_8 is electrically connected to the wiring 12.

In the first flip-flop 10_1, the clock signal CK61 is input to the first input terminal 21; the clock signal CK62 is input to the second input terminal 22; the clock signal CK63 is input to the third input terminal 23; the start pulse is input to the fourth input terminal 24; the output signal OUT(3) is input to the fifth input terminal 25; the output signal OUT(1)(SR) is output from the first output terminal 26; and the output signal OUT(1) is output from the second output terminal 27.

Next, an example of a specific circuit structure of the flip-flop will be described with reference to FIG. 13C and FIG. 14A.

Figure 13C:
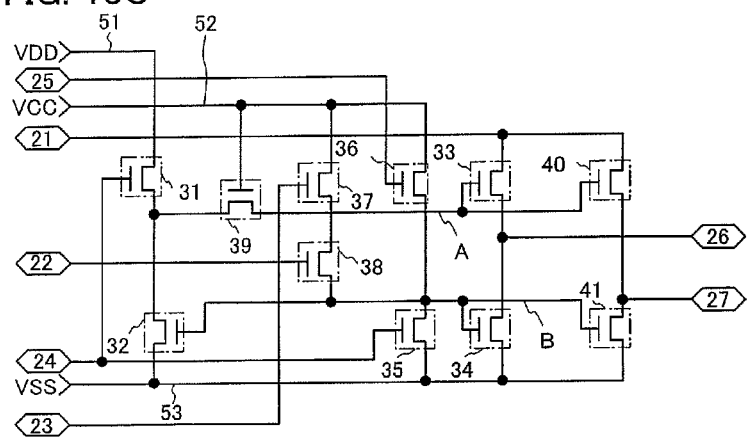
Figure 14A:
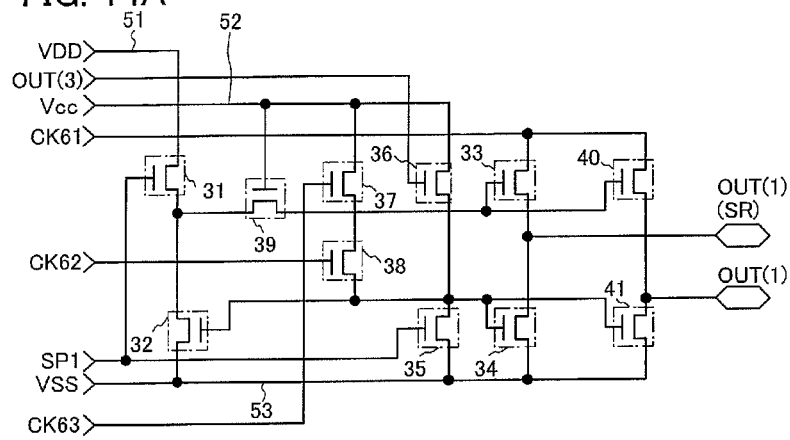
FIG. 14A is a circuit diagram illustrating a structure of a shift register in Embodiment 6 and FIG. 14B is a timing chart for describing operation of a shift register in Embodiment 6.

The flip-flop in FIG. 13C and FIG. 14A includes first to eleventh transistors 31 to 41. Signals or power supply voltages are supplied to the first to eleventh transistors 31 to 41 from a power supply line 51 to which a high power supply voltage VDD is supplied, a power supply line 52 to which a high power supply voltage VCC is supplied, and a power supply line 53 to which a low power supply voltage VSS is supplied, in addition to the above-described first to fifth input terminals 21 to 25. Further, the flip-flop in FIG. 13C and FIG. 14A outputs signals through the first output terminal 26 and the second output terminal 27. Here, the high power supply voltage VDD is higher than or equal to the high power supply voltage VCC and the high power supply voltage VCC is higher than the low power supply voltage VSS. Note that the clock signals CK61 to CK68 each alternate between high level and low level; the voltage of the high-level clock signal is the high power supply voltage VDD and the voltage of the low-level clock signal is the low power supply voltage VSS. The high power supply voltage VDD applied to the power supply line 51 is set to be higher than the high power supply voltage VCC applied to the power supply line 52, whereby a voltage applied to a gate of a transistor can be lowered, shift in the threshold voltage of the transistor can be reduced, and deterioration of the transistor can be suppressed, without an adverse effect on the operation of the transistor.

In FIG. 13C and FIG. 14A, one of a source and a drain of the first transistor 31 is electrically connected to the power supply line 51, the other of the source and the drain of the first transistor 31 is electrically connected to one of a source and a drain of the ninth transistor 39, and a gate of the first transistor 31 is electrically connected to the fourth input terminal 24. One of a source and a drain of the second transistor 32 is electrically connected to the power supply line 53, the other of the source and the drain of the second transistor 32 is electrically connected to the one of the source and the drain of the ninth transistor 39, and a gate of the second transistor 32 is electrically connected to a gate of the fourth transistor 34. One of a source and a drain of the third transistor 33 is electrically connected to the first input terminal 21, the other of the source and the drain of the third transistor 33 is electrically connected to the first output terminal 26. One of a source and a drain of the fourth transistor 34 is electrically connected to the power supply line 53 and the other of the source and the drain of the fourth transistor 34 is electrically connected to the first output terminal 26. One of a source and a drain of the fifth transistor 35 is electrically connected to the power supply line 53, the other of the source and the drain of the fifth transistor 35 is electrically connected to the gate of the second transistor 32 and the gate of the fourth transistor 34, and a gate of the fifth transistor 35 is electrically connected to the fourth input terminal 24. One of a source and a drain of the sixth transistor 36 is electrically connected to the power supply line 52, the other of the source and the drain of the sixth transistor 36 is electrically connected to the gate of the second transistor 32 and the gate of the fourth transistor 34, and a gate of the sixth transistor 36 is electrically connected to the fifth input terminal 25. One of a source and a drain of the seventh transistor 37 is electrically connected to the power supply line 52, the other of the source and the drain of the seventh transistor 37 is electrically connected to one of a source and a drain of the eighth transistor 38, and a gate of the seventh transistor 37 is electrically connected to the third input terminal 23. The other of the source and the drain of the eighth transistor 38 is electrically connected to the gate of the second transistor 32 and the gate of the fourth transistor 34, and a gate of the eighth transistor 38 is electrically connected to the second input terminal 22. The one of the source and the drain of the ninth transistor 39 is electrically connected to the other of the source and the drain of the first transistor 31 and the other of the source and the drain of the second transistor 32, the other of the source and the drain of the ninth transistor 39 is electrically connected to a gate of the third transistor 33 and a gate of the tenth transistor 40, and a gate of the ninth transistor 39 is electrically connected to the power supply line 52. One of a source and a drain of the tenth transistor 40 is electrically connected to the first input terminal 21, the other of the source and the drain of the tenth transistor 40 is electrically connected to the second output terminal 27, and the gate of the tenth transistor 40 is electrically connected to the other of the source and the drain of the ninth transistor 39. One of a source and a drain of the eleventh transistor 41 is electrically connected to the power supply line 53, the other of the source and the drain of the eleventh transistor 41 is electrically connected to the second output terminal 27, and a gate of the eleventh transistor 41 is electrically connected to the gate of the second transistor 32 and the gate of the fourth transistor 34.

In FIG. 13C, a portion where the gate of the third transistor 33, the gate of the tenth transistor 40, and the other of the source and the drain of the ninth transistor 39 are connected to one another is referred to as a node A. In addition, a portion where the gate of the second transistor 32, the gate of the fourth transistor 34, the other of the source and the drain of the fifth transistor 35, the other of the source and the drain of the sixth transistor 36, the other of the source and the drain of the eighth transistor 38, and the gate of the eleventh transistor 41 are connected to one another is referred to as a node B.

Figure 14B:
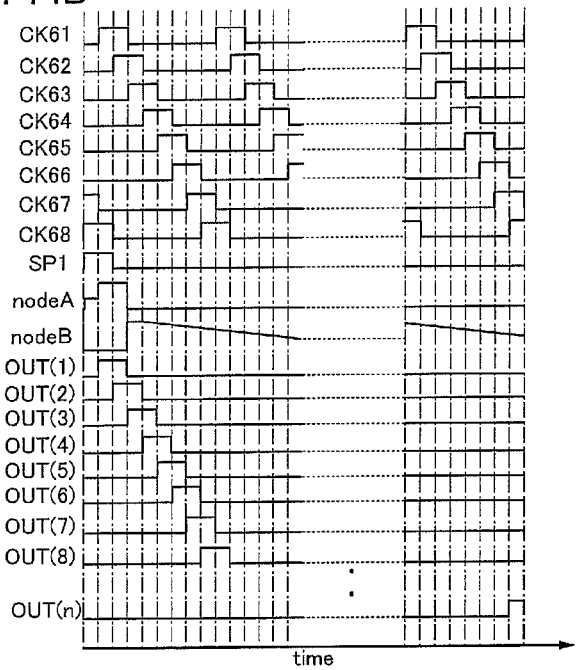

Here, FIG. 14B illustrates a timing chart of the shift register including the plurality of flip-flops illustrated in FIG. 14A.

As illustrated in FIG. 14B, in a period when a clock signal input through the input terminal 21 is at high level, an output signal from a flip-flop to which the clock signal is input is at high level. Further, timings at which output signals of the flip-flops are at high level are delayed for ¼ cycle sequentially.

Note that as illustrated in FIG. 14A, by providing the ninth transistor 39 whose gate is supplied with the high power supply voltage VCC, advantages described below are obtained before and after bootstrap operation.

Without the ninth transistor 39 whose gate is supplied with the high power supply voltage VCC, if the voltage of the node A is raised by bootstrap operation, the voltage of the other of the source and the drain of the first transistor 31 rises to a value higher than the high power supply voltage VDD. Then, the source of the first transistor 31 switched to the power supply line 51 side. Therefore, in the first transistor 31, a high bias voltage is applied between the gate and the source and between the gate and the drain. Thus, significant stress and increase in power consumption are caused, which might cause deterioration in the transistor. On the other hand, with the ninth transistor 39 whose gate is supplied with the high power supply voltage VCC, increase in the voltage of the other of the source and the drain of the first transistor 31 can be prevented while the voltage of the node A is increased by bootstrap operation. In other words, by providing the ninth transistor 39, a negative bias voltage applied between the gate and the source of the first transistor 31 can be reduced. Accordingly, with a circuit structure in this embodiment, a negative bias voltage applied between the gate and the source of the first transistor 31 can be reduced, so that deterioration of the first transistor 31, which is due to stress, can be suppressed.

Note that the ninth transistor 39 can be provided anywhere as long as the drain and the source of the ninth transistor 39 are connected to the other of the source and the drain of the first transistor 31 and the gate of the third transistor 33. Note that when the shift register including the plurality of flip-flops in this embodiment is included in a signal line driver circuit having a larger number of stages than a scan line driver circuit, the ninth transistor 39 can be eliminated, which is advantageous in that the number of transistors is reduced.

When an oxide semiconductor is used for semiconductor layers of the first to eleventh transistors 31 to 41, off-current of the thin film transistors can be reduced, on-current and field-effect mobility can be increased, and the degree of deterioration can be reduced; thus, malfunction in a circuit can be reduced. Moreover, when a high voltage is applied to a gate, the degree of deterioration of the transistor including an oxide semiconductor is smaller than that of a transistor including amorphous silicon. Consequently, similar operation can be obtained even when the high power supply voltage VDD is supplied to, for example, the power supply line to which the high power supply potential VCC is supplied, and the number of power supply lines placed between circuits can be reduced; thus, the size of the circuit can be reduced.

Note that a similar effect is obtained even when the connection relation is changed so that the clock signal CK62 is supplied from the second input terminal 22 to the gate of the seventh transistor 37 and the clock signal CK63 is supplied from the third input terminal 23 to the gate of the eighth transistor 38. In the shift register illustrated in FIG. 14A, states of the seventh transistor 37 and the eighth transistor 38 are changed so that both the seventh transistor 37 and the eighth transistor 38 are on, then the seventh transistor 37 is off and the eighth transistor 38 is on, and then the seventh transistor 37 and the eighth transistor 38 are off; thus, the fall in voltage of the node B due to fall in voltages of the second input terminal 22 and the third input terminal 23 is caused twice by fall in voltage of the gate of the seventh transistor 37 and fall in voltage of the gate of the eighth transistor 38. On the other hand, in the shift register illustrated in FIG. 14A, states of the seventh transistor 37 and the eighth transistor 38 are changed so that both the seventh transistor 37 and the eighth transistor 38 are on, then the seventh transistor 37 is on and the eighth transistor 38 is off, and then the seventh transistor 37 and the eighth transistor 38 are off; thus, the fall in the voltage of the node B due to the fall in the voltages of the second input terminal 22 and the third input terminal 23 is caused once by the fall in the voltage of the gate of the eighth transistor 38. Consequently, it is preferable to use the clock signal supplied to the gate of the seventh transistor 37 from the third input terminal 23 and the clock signal supplied to the gate of the eighth transistor 38 from the second input terminal 22 in order to reduce fluctuation in voltage of the node B, because noise can be reduced.

In such a manner, a high-level voltage is regularly supplied to the node B in a period during which the voltages of the first output terminal 26 and the second output terminal 27 are held at low level; thus, malfunction of the flip-flop can be suppressed.

Embodiment 7

In this embodiment, a liquid crystal display device will be described as an example of the display device described in Embodiment 6.

Figure 15:
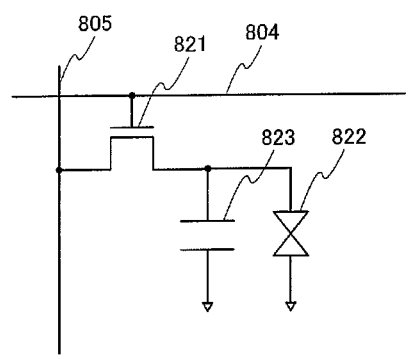
FIG. 15 is a circuit diagram illustrating a circuit structure of a pixel in a display device in Embodiment 7.

An example of a circuit structure of a pixel in the display device in this embodiment will be described with reference to FIG. 15. FIG. 15 is a circuit diagram illustrating a circuit structure of a pixel in the display device in this embodiment.

As illustrated in FIG. 15, the pixel includes a transistor 821, a liquid crystal element 822, and a capacitor 823.

The transistor 821 functions as a selection switch. A gate of the transistor 821 is electrically connected to a scan line 804, and one of a source and a drain thereof is electrically connected to a signal line 805.

The liquid crystal element 822 has a first terminal and a second terminal. The first terminal is electrically connected to the other of the source and the drain of the transistor 821. A ground potential or a voltage with a given value is applied to the second terminal. The liquid crystal element 822 includes a first electrode serving as part or all of the first terminal, a second electrode serving as part or all of the second terminal, and a layer including liquid crystal molecules whose transmittance is changed by applying voltage between the first electrode and the second electrode (such a layer is referred to as a liquid crystal layer).

The capacitor 823 has a first terminal and a second terminal. The first terminal is electrically connected to the other of the source and the drain of the transistor 821. The ground potential or a voltage with a given value is applied to the second terminal. The capacitor 823 includes a first electrode serving as part or all of the first terminal, a second electrode serving as part or all of the second terminal, and a dielectric layer. The capacitor 823 has a function as a storage capacitor of the pixel. Note that although the capacitor 823 is not necessarily provided, the provision of the capacitor 823 can reduce adverse effects due to leakage current of the transistor 821.

For the display device in this embodiment, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, and the like can be used.

Alternatively, liquid crystal exhibiting a blue phase for which an alignment film is not necessary may be used. A blue phase is a kind of liquid crystal phase and appears just before phase transition from a cholesteric phase to an isotropic phase when temperature of cholesteric liquid crystal rises. Since the blue phase appears only within a narrow temperature range, a liquid crystal composition containing a chiral agent at 5 wt. % or more in order to improve the temperature range is used for the liquid crystal layer. The liquid crystal composition which contains liquid crystal exhibiting a blue phase and a chiral agent has a small response time of 10 µs to 100 µs, has optical isotropy, and has a small viewing angle dependence.

Next, operation of the pixel illustrated in FIG. 15 is described.

First, a pixel to which data is written is selected, and the transistor 821 in the selected pixel is turned on by a signal input from the scan line 804.

At this time, a data signal from the signal line 805 is input through the transistor 821, so that the first terminal of the liquid crystal element 822 has the same voltage as the data signal, and the transmittance of the liquid crystal element 822 is set in accordance with voltage applied between the first terminal and the second terminal. After data writing, the transistor 821 is turned off by a signal input from the scan line 804, the transmittance of the liquid crystal element 822 is maintained during a display period, and the pixel enters into a display state. The above operation is sequentially performed per scan line 804, and the above operation is performed in all the pixels. The above is the operation of the pixel.

In displaying moving images in a liquid crystal display device, there is a problem in that an afterimage or motion blur occurs because of slow response of liquid crystal molecules themselves. In order to improve moving image characteristics of the liquid crystal display device, there is a driving technique called black insertion, in which the entire screen is displayed as black every other frame.

Moreover, a driving technique called double-frame rate driving may be employed in which the vertical synchronizing frequency is 1.5 times or more, preferably twice or more as high as a conventional vertical synchronizing frequency, whereby the response speed is improved.

Further, in order to improve the moving image characteristics of the liquid crystal display device, there is a driving technique in which a plurality of LED (light-emitting diode) light sources, a plurality of EL light sources, or the like are used as backlights to form an area light source, and the light sources forming the area light source are independently lit intermittently in one frame period. For the area light source, LEDs of three kinds or more or an LED which emits white light may be used. Since a plurality of LEDs can be independently controlled, the timing when the LED emits light can be synchronized with the timing when optical modulation of the liquid crystal layer is changed. Part of the LEDs can be turned off in this driving technique, so that power consumption can be reduced particularly in the case of displaying an image in which a black display region occupies a large area in one screen.

By combining these driving techniques, display characteristics such as moving image characteristics of the liquid crystal display device can be improved as compared to those of a conventional liquid crystal display device.

Figure 16A:
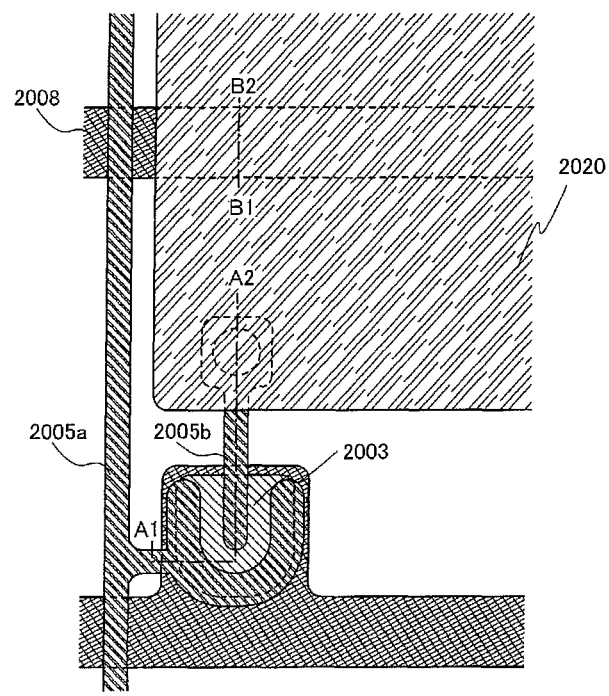
FIGS. 16A and 16B are views illustrating a structure of a pixel in a display device in Embodiment 7.
Figure 16B:
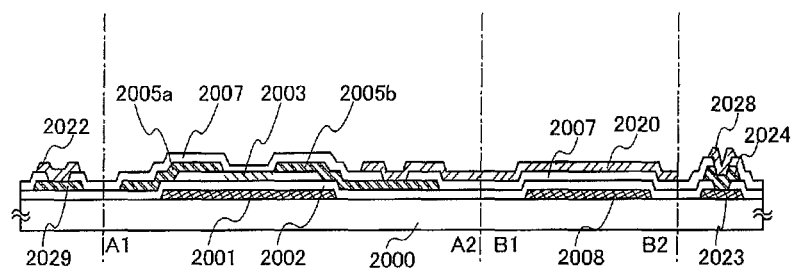

Next, a structure of the display device in this embodiment, which includes the above pixel, is described with reference to FIGS. 16A and 16B. FIGS. 16A and 16B illustrate a structure of the pixel in the display device in this embodiment. FIG. 16A is a top view of the pixel, and FIG. 16B is a cross-sectional view. Note that dotted lines A1-A2 and B1-B2 in FIG. 16A correspond to cross sections A1-A2 and B1-B2 in FIG. 16B, respectively.

As illustrated in FIGS. 16A and 16B, the display device in this embodiment includes, in the cross section A1-A2, a gate electrode 2001 over a substrate 2000, an insulating film 2002 provided over the gate electrode 2001, an oxide semiconductor layer 2003 provided over the insulating film 2002, a pair of electrodes 2005a and 2005b provided over the oxide semiconductor layer 2003, an oxide insulating layer 2007 provided over the electrodes 2005a and 2005b and the oxide semiconductor layer 2003, and an electrode 2020 which is in contact with the electrode 2005b through an opening portion provided in the oxide insulating layer 2007.

Moreover, the display device includes, in the cross section B1-B2, an electrode 2008 over the substrate 2000, the insulating film 2002 over the electrode 2008, the oxide insulating layer 2007 provided over the insulating film 2002, and the electrode 2020 provided over the oxide insulating layer 2007.

Electrodes 2022 and 2029 and electrodes 2023, 2024, and 2028 serve as an electrode or a wiring for connection with an FPC.

The transistors described in Embodiments 3 to 5 can be used for the transistors in this embodiment, for example; therefore, detailed description is omitted here.

The electrodes 2020, 2029, and 2028 are formed using indium oxide ($In_2O_3$), an alloy of indium oxide and tin oxide ($In_2O_3$—$SnO_2$, referred to as ITO), or the like by a sputtering method, a vacuum evaporation method, or the like. Such a material is etched with a hydrochloric acid-based solution. However, since a residue is easily generated particularly in etching ITO, an alloy of indium oxide and zinc oxide ($In_2O_3$—ZnO) may be used to improve etching processability.

Further, FIGS. 17A1 and 17A2 are a cross-sectional view and a top view of a gate wiring terminal portion at this stage. FIG. 17A1 is the cross-sectional view taken along line C1-C2 of FIG. 17A2. In FIG. 17A1, a transparent conductive film 2055 formed over a protective insulating film 2054 is a terminal electrode for connection, which functions as an input terminal. Further, in FIG. 17A1, in the terminal portion, a first terminal 2051 which is formed of the same material as a gate wiring and a connection electrode 2053 which is formed of the same material as a source wiring overlap with each other with a gate insulating layer 2052 therebetween, and the first terminal 2051 and the transparent conductive film 2055 are in direct contact with each other in a contact hole provided in the gate insulating layer 2052 to form conduction. Moreover, the connection electrode 2053 and the transparent conductive film 2055 are in direct contact with each other in a contact hole provided in the protective insulating film 2054 to form conduction.

FIGS. 17B1 and 17B2 are a cross-sectional view and a top view of a source wiring terminal portion. FIG. 17B1 is the cross-sectional view taken along line C3-C4 of FIG. 17B2. In FIG. 17B1, the transparent conductive film 2055 formed over the protective insulating film 2054 is a terminal electrode for connection, which functions as an input terminal. Moreover, in FIG. 17B1, in the terminal portion, an electrode 2056 which is formed of the same material as the gate wiring is placed below a second terminal 2050 which is electrically connected to the source wiring, so as to overlap with the second terminal 2050 with the gate insulating layer 2052 therebetween. The electrode 2056 is not electrically connected to the second terminal 2050. When the electrode 2056 is set to have voltage different from that of the second terminal 2050, for example, a floating voltage, GND, or 0 V, capacitance for preventing noise or static electricity can be formed. Further, the second terminal 2050 is electrically connected to the transparent conductive film 2055 through the protective insulating film 2054.

A plurality of gate wirings, source wirings, and capacitor wirings are provided depending on the pixel density. In the terminal portion, a plurality of first terminals at the same voltage as the gate wiring, a plurality of second terminals at the same voltage as the source wiring, a plurality of third terminals at the same voltage as the capacitor wiring, and the like are arranged. The number of each of the terminals may be any number and may be determined by a practitioner as appropriate.

Accordingly, a pixel TFT portion including a bottom-gate n-channel TFT and a storage capacitor can be completed. By disposing the TFT and the storage capacitor in each pixel of a pixel portion in which pixels are arranged in matrix, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

The n-channel transistor obtained in this embodiment uses an In—Ga—Zn—O-based non-single-crystal film for its channel formation region and has favorable dynamic characteristics. Accordingly, these driving techniques can be applied in combination.

Further, when a light-emitting display device is manufactured, in order to set one electrode (also referred to as a cathode) of an organic light-emitting element to have a low power supply voltage VSS, for example, GND or 0 V, a fourth terminal for making the cathode have the low power supply voltage VSS such as GND or 0 V is provided in a terminal portion. Also in manufacturing a light-emitting display device, a power supply line is provided in addition to a source wiring and a gate wiring. Accordingly, the terminal portion is provided with a fifth terminal electrically connected to the power supply line.

A gate line driver circuit or a source line driver circuit is formed using TFTs including an oxide semiconductor, whereby manufacturing cost is reduced. Moreover, a gate electrode of the TFT included in the driver circuit is directly connected to a source wiring or a drain wiring so that the number of contact holes is reduced, whereby a display device can be provided in which the area occupied by the driver circuit is reduced.

Therefore, according to this embodiment, a display device having high electrical properties and high reliability can be provided at low cost.

Note that this embodiment can be combined with or replaced by any of the other embodiments as appropriate.

Embodiment 8

In this embodiment, a light-emitting display device will be described as an example of the display device described in Embodiment 6. In this embodiment, a light-emitting display device in which electroluminescence is used for a light-emitting element will be described as an example.

Light-emitting elements utilizing electroluminescence are classified according to whether a light-emitting material is an organic compound or an inorganic compound. In general, the former is referred to as an organic EL element, and the latter as an inorganic EL element.

In an organic EL element, by application of voltage to the light-emitting element, electrons and holes are separately injected from a pair of electrodes into a layer containing a light-emitting organic compound, and current flows. Then, the carriers (electrons and holes) are recombined, thereby emitting light. Based on such a mechanism, such a light-emitting element is referred to as a current-excitation light-emitting element.

Inorganic EL elements are classified, according to the element structures, into a dispersion inorganic EL elements and thin-film inorganic EL elements. A dispersion inorganic EL element includes a light-emitting layer where particles of a light-emitting material are dispersed in a binder, and its light emission mechanism is donor-acceptor recombination light emission utilizing a donor level and an acceptor level. A thin-film inorganic EL element has a structure in which a light-emitting layer is sandwiched between dielectric layers, which are further sandwiched between electrodes, and its light emission mechanism is localized light emission utilizing inner-shell electron transition of metal ions. Note that, an organic EL element is described as a light-emitting element here.

Figure 18:
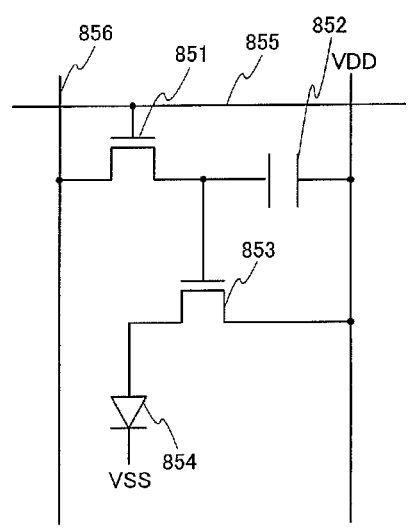
FIG. 18 is a circuit diagram illustrating a circuit structure of a pixel in a display device in Embodiment 8.

A circuit structure of a pixel in a display device in this embodiment will be described with reference to FIG. 18. FIG. 18 is a circuit diagram illustrating a circuit structure of a pixel in the display device in this embodiment.

As illustrated in FIG. 18, the pixel of the display device in this embodiment includes a transistor 851, a capacitor 852 serving as a storage capacitor in the pixel, a transistor 853, and a light-emitting element 854.

A gate of the transistor 851 is electrically connected to a scan line 855, and one of a source and a drain thereof is electrically connected to a signal line 856. A high power supply voltage VDD is applied to the other of the source and the drain of the transistor 851 through the capacitor 852.

A gate of the transistor 853 is electrically connected to the other of the source and the drain of the transistor 851. The high power supply voltage VDD is applied to one of a source and a drain of the transistor 853.

The light-emitting element 854 has a first terminal and a second terminal. The first terminal is electrically connected to the other of the source and the drain of the transistor 853. A low power supply voltage VSS is applied to the second terminal.

Next, operation of the pixel illustrated in FIG. 18 will be described.

First, a pixel to which data is written is selected. In the selected pixel, the transistor 851 is turned on by a scan signal input from the scan line 855, and a video signal (also referred to as a data signal), which is a fixed voltage, is input from the signal line 856 to the gate of the transistor 853.

The transistor 853 is turned on or off by a voltage in response to the data signal input to the gate. When the transistor 853 is on, voltage of the light-emitting element 854 depends on a gate voltage of the transistor 853 and a first voltage. At this time, current flows through the light-emitting element 854 depending on the voltage applied between the first terminal and the second terminal, and the light-emitting element 854 emits light with luminance in response to the amount of current flowing therethrough. Further, since the gate voltage of the transistor 853 is held for a certain period by the capacitor 852, the light-emitting element 854 maintains a light-emitting state for a certain period.

When the data signal input from the signal line 856 to the pixel is digital, the pixel enters into a light-emitting state or a non-light-emitting state by switching on and off of the transistor 851. Thus, gray levels can be expressed by an area ratio grayscale method or a time ratio grayscale method. An area ratio grayscale method refers to a driving method by which one pixel is divided into a plurality of subpixels and the subpixels each having the structure illustrated in FIG. 18 are independently driven based on data signals so that grayscale is displayed. Further, a time ratio grayscale method refers to a driving method by which a period during which a pixel emits light is controlled so that grayscale is displayed.

Since the response time of a light-emitting element is higher than that of a liquid crystal element or the like, the light-emitting element is suitable for a time ratio grayscale method as compared to the liquid crystal element. Specifically, when display is performed by a time ratio grayscale method, one frame period is divided into a plurality of subframe periods. Then, in accordance with video signals, the light-emitting element in the pixel is set in a light-emitting state or in a non-light-emitting state during each subframe period. By dividing one frame period into a plurality of subframe periods, the total length of time, in which a pixel actually emits light in one frame period, can be controlled by video signals, and grayscale can be displayed.

Among driver circuits in the light-emitting display device, part of a driver circuit which can be formed using n-channel TFTs can be formed over a substrate where TFTs in a pixel portion are formed. Moreover, a signal line driver circuit and a scan line driver circuit can be formed using only n-channel TFTs.

Next, structures of the light-emitting element will be described with reference to FIGS. 19A to 19C. Here, a cross-sectional structure of a pixel in the case of an n-channel driving TFT is described as an example. TFTs 7001, 7011, and 7021, which are driving TFTs used in a display device in FIGS. 19A, 19B, and 19C respectively, can be formed in a manner similar to the TFTs described in the above embodiments, include an oxide semiconductor layer as a semiconductor layer, and have high reliability.

In order to extract light emitted from the light-emitting element, at least one of an anode and a cathode needs to be transparent. A TFT and a light-emitting element are formed over a substrate. There are light-emitting elements having a top emission structure in which light is extracted through a surface opposite to the substrate, having a bottom emission structure in which light is extracted through a surface on the substrate side, and having a dual emission structure in which light is extracted through a surface on the substrate side and a surface opposite to the substrate. The pixel structure of the present invention can be applied to the light-emitting element having any of these emission structures.

A light-emitting element having a top emission structure will be described with reference to FIG. 19A.

Figure 19A:
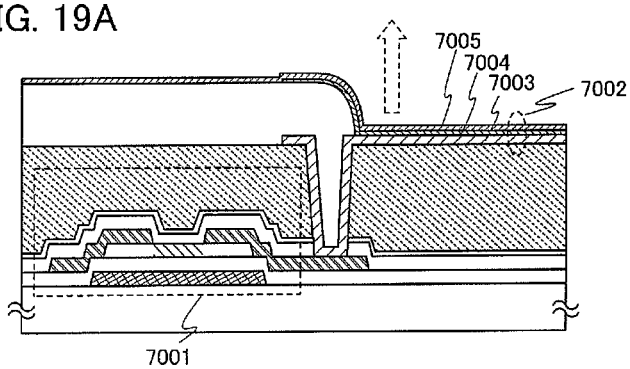
FIGS. 19A to 19C each are a cross-sectional view illustrating a structure of a pixel in a display device in Embodiment 8.
Figure 19B:
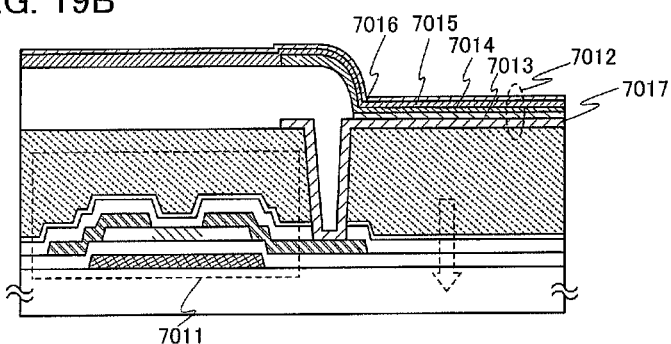
Figure 19C:
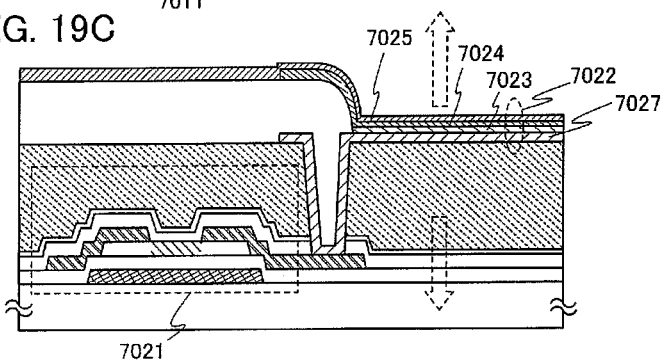

FIG. 19A is a cross-sectional view of a pixel in the case where a driving TFT 7001 is an n-channel TFT and light is emitted from a light-emitting element 7002 to an anode 7005 side. In FIG. 19A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injection layer, an electron-transport layer, a light-emitting layer, a hole-transport layer, and a hole-injection layer in this order over the cathode 7003. It is not necessary to form all of these layers. The anode 7005 is formed using a light-transmitting conductive film formed from a light-transmitting conductive material such as indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 19A, light is emitted from the light-emitting element 7002 to the anode 7005 side as indicated by an arrow.

Next, a light-emitting element having a bottom emission structure will be described with reference to FIG. 19B. FIG. 19B is a cross-sectional view of a pixel in the case where the driving TFT 7011 is an n-channel TFT, and light is emitted from a light-emitting element 7012 to the cathode 7013 side. In FIG. 19B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. Note that a light-blocking film 7016 for reflecting or blocking light may be formed so as to cover the anode 7015 when the anode 7015 has a light-transmitting property. For the cathode 7013, a variety of materials can be used as long as they are conductive materials having a low work function, as in the case of FIG. 19A. Note that the cathode 7013 is formed to have a thickness which allows light transmission (preferably, approximately 5 nm to 30 nm). For example, an aluminum film with a thickness of 20 nm can be used for the cathode 7013. As in the case of FIG. 19A, the light-emitting layer 7014 may be formed using a single layer or a plurality of layers stacked. The anode 7015 is not required to transmit light, but can be formed using a light-transmitting conductive material as in the case of FIG. 19A. The light-blocking film 7016 can be formed using, for example, a metal which reflects light; however, it is not limited to a metal film. For example, a resin to which a black pigment is added can be used.

The light-emitting element 7012 corresponds to a region where the light-emitting layer 7014 is sandwiched between the cathode 7013 and the anode 7015. In the case of the pixel illustrated in FIG. 19B, light is emitted from the light-emitting element 7012 to the cathode 7013 side as indicated by an arrow.

Next, a light-emitting element having a dual emission structure will be described with reference to FIG. 19C. In FIG. 19C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 19A, the cathode 7023 can be formed using a variety of conductive materials as long as they have a low work function. Note that the cathode 7023 is formed to have a thickness which allows light transmission. For example, a film of Al having a thickness of 20 nm can be used for the cathode 7023. As in the case of FIG. 19A, the light-emitting layer 7024 may be formed using a single layer or a plurality of layers stacked. The anode 7025 can be formed using a light-transmitting conductive material as in the case of FIG. 19A.

The light-emitting element 7022 corresponds to a region where the cathode 7023, the light-emitting layer 7024, and the anode 7025 overlap with one another. In the case of the pixel illustrated in FIG. 19C, light is emitted from the light-emitting element 7022 to both the anode 7025 side and the cathode 7023 side as indicated by arrows.

Note that although the organic EL elements are described here as the light-emitting elements, an inorganic EL element can also be provided as a light-emitting element.

Note that in this embodiment, the example is described in which a TFT (also referred to as a driving TFT) which controls driving of a light-emitting element is electrically connected to the light-emitting element; alternatively, a structure may be employed in which a TFT for current control is connected between the driving TFT and the light-emitting element.

Next, the appearance and cross section of the display device (also referred to as a light-emitting panel) in this embodiment will be described with reference to FIGS. 20A and 20B. FIG. 20A is a top view of the display device in this embodiment, in which a TFT and a light-emitting element formed over a first substrate are sealed between the first substrate and a second substrate by a sealing material. FIG. 20B is a cross-sectional view taken along line H-I in FIG. 20A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. In such a manner, it is preferable to pack (seal) the pixel portion 4502, the signal line driver circuits 4503a and 4503b, and the scan line driver circuits 4504a and 4504b with a protective film (such as an attachment film or an ultraviolet curable resin film) or a cover material with high air-tightness and little degasification so that the pixel portion 4502, the signal line driver circuits 4503a and 4503b, and the scan line driver circuits 4504a and 4504b are not exposed to the air.

The pixel portion 4502, the signal line driver circuits 4503a and 4503b, and the scan line driver circuits 4504a and 4504b, which are formed over the first substrate 4501, each include a plurality of TFTs. In FIG. 20B, a TFT 4510 included in the pixel portion 4502 and a TFT 4509 included in the signal line driver circuit 4503a are illustrated as an example.

As the TFTs 4509 and 4510, the highly reliable TFTs described in any of Embodiments 3 to 5, which include an oxide semiconductor layer as a semiconductor layer, can be used. In this embodiment, the TFTs 4509 and 4510 are n-channel TFTs. An insulating layer 4542 is formed over the TFTs 4509 and 4510 and an insulating layer 4544 is formed over the insulating layer 4542.

Moreover, reference numeral 4511 denotes a light-emitting element. A first electrode 4517 which is a pixel electrode included in the light-emitting element 4511 is electrically connected to a source electrode or a drain electrode of the TFT 4510. Note that the light-emitting element 4511 has a stacked structure of the first electrode 4517, an electroluminescent layer 4512, and a second electrode 4513; however, the structure of the light-emitting element is not limited to that shown in this embodiment. The structure of the light-emitting element 4511 can be changed as appropriate depending on the direction in which light is extracted from the light-emitting element 4511, or the like.

A bank 4520 is formed using an organic resin film, an inorganic insulating film, or organic polysiloxane. In particular, it is preferable that the bank 4520 be formed using a photosensitive material to have an opening portion over the first electrode 4517, and a sidewall of the opening portion be formed as an inclined surface with a continuous curvature.

The electroluminescent layer 4512 may be formed with a single layer or a plurality of layers stacked.

In order to prevent oxygen, hydrogen, moisture, carbon dioxide, or the like from entering the light-emitting element 4511, a protective layer may be formed over the second electrode 4513 and the bank 4520. As the protective layer, a silicon nitride film, a silicon nitride oxide film, a DLC film, or the like can be formed.

A variety of signals and voltages are supplied to the signal line driver circuits 4503a and 4503b, the scan line driver circuits 4504a and 4504b, or the pixel portion 4502 from an FPC 4518a and an FPC 4518b.

In this embodiment, a connection terminal electrode 4515 is formed using the same conductive film as the first electrode 4517 included in the light-emitting element 4511. A terminal electrode 4516 is formed using the same conductive film as the source electrodes and the drain electrodes of the TFTs 4509 and 4510.

The connection terminal electrode 4515 is electrically connected to a terminal included in the FPC 4518a via an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used for the substrate.

As the filler 4507, an ultraviolet curable resin or a thermosetting resin can be used in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, a polarizing plate or a circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. In addition, only the signal line driver circuits or part thereof, or only the scan line driver circuits or part thereof may be separately formed and mounted. This embodiment is not limited to the structure illustrated in FIGS. 20A and 20B.

Through the above steps, a highly reliable light-emitting display device (display panel) can be manufactured.

This embodiment can be combined with or replaced by any of the other embodiments as appropriate.

Embodiment 9

In this embodiment, electronic paper will be described as an example of the display device described in Embodiment 6.

The shift register described in the above embodiments can be used in electronic paper. Electronic paper is also referred to as an electrophoretic display device (an electrophoretic display) and has advantages in that it has high readability which is equivalent to normal paper, it has less power consumption than other display devices, and it can be made thin and lightweight.

Electrophoretic displays can have various modes. An electrophoretic display contains a plurality of microcapsules dispersed in a solvent or a solute, each of which contains first particles that are positively charged and second particles that are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. An electrophoretic display does not need a polarizing plate and a counter substrate, which are required in a liquid crystal display device, so that the thickness and weight of the electrophoretic display device can be reduced.

A solution in which the above-described microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the microcapsules are arranged as appropriate over an active matrix substrate so as to be interposed between two electrodes, an active matrix display device can be completed, and display can be performed by application of an electric field to the microcapsules. For example, an active matrix substrate formed using the TFT described in any of the above embodiments can be used.

Note that the first particles and the second particles in the microcapsules may be formed from one of a conductive material, an insulating material, a semiconductor material, a magnetic material, a liquid crystal material, a ferroelectric material, an electroluminescent material, an electrochromic material, and a magnetophoretic material or a composite material of any of these materials.

Figure 21:
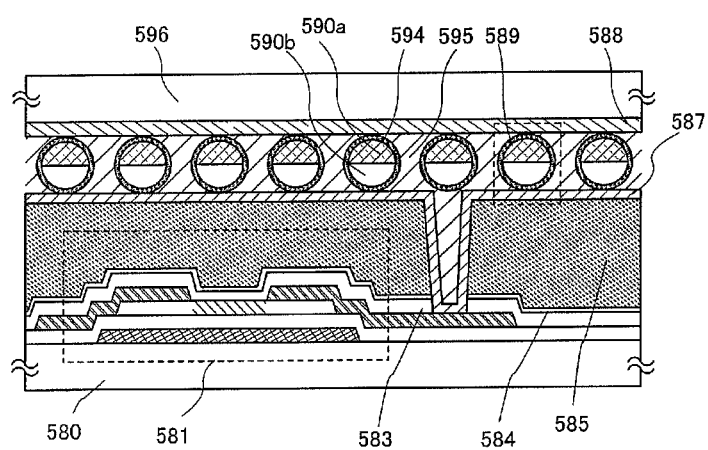
FIG. 21 is a cross-sectional view illustrating a structure of electronic paper in Embodiment 9.

Next, an example of a structure of electronic paper in this embodiment will be described with reference to FIG. 21. FIG. 21 is a cross-sectional view illustrating a structure of electronic paper in this embodiment.

The electronic paper illustrated in FIG. 21 includes a TFT 581 over a substrate 580, insulating layers 583, 584, and 585 which are stacked over the TFT 581, an electrode 587 which is in contact with a source electrode or a drain electrode of the TFT 581 through an opening portion provided in the insulating layers 583 to 585. In addition, the electronic paper includes, between the electrode 587 and an electrode 588 provided on a substrate 596, spherical particles 589, each of which includes a black region 590a, a white region 590b, and a cavity 594 which surrounds the black region 590a and the white region 590b and is filled with a liquid, and a filler 595 provided around the spherical particles 589.

The TFT 581 is a highly reliable TFT including an oxide semiconductor layer as a semiconductor layer and can be manufactured in a manner similar to the TFTs described in any of the above embodiments, for example.

A method in which the spherical particles 589 are used is called a twisting ball display method. In the twisting ball display method, spherical particles each colored in black and white are arranged between a first electrode and a second electrode, which are electrodes used for a display element, and potential difference is generated between the first electrode and the second electrode to control orientation of the spherical particles; accordingly, display is performed.

Further, instead of an element including the spherical particles, an electrophoretic element can also be used. A microcapsule having a diameter of approximately 10 μm to 200 μm in which transparent liquid, positively charged white microparticles, and negatively charged black microparticles are encapsulated, is used. In the microcapsule provided between the first electrode and the second electrode, when an electric field is applied by the first electrode and the second electrode, the white microparticles and the black microparticles move to opposite directions to each other, so that white or black can be displayed. A display element using this principle is an electrophoretic display element. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

The shift register in Embodiment 1 can be used in a driver circuit of the electronic paper of this embodiment, for example. Further, since a transistor using an oxide semiconductor layer can be applied to a transistor in the display portion, the driver circuit and the display portion can be provided over one substrate, for example.

Figure 22:
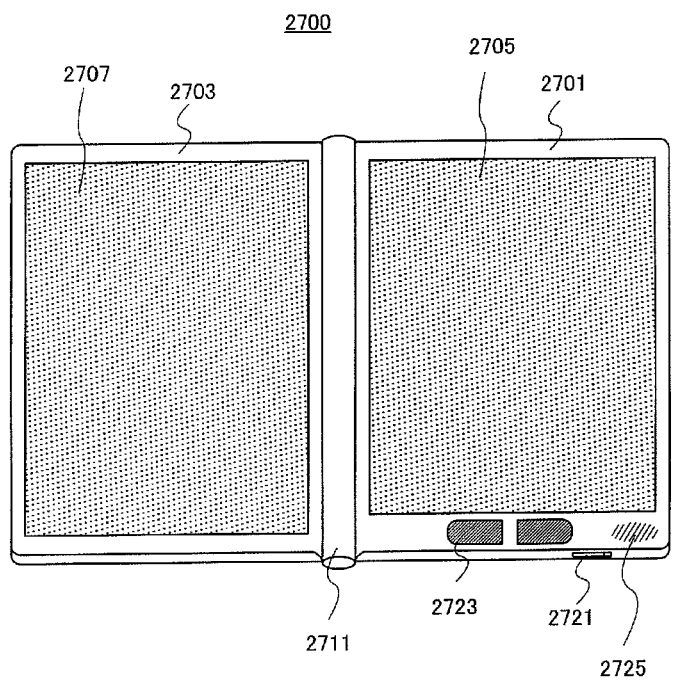
FIG. 22 illustrates an electronic device to which electronic paper in Embodiment 9 is applied.

The electronic paper can be used in electronic appliances of various fields, which display information. For example, the electronic paper can be applied to e-book readers (electronic books), posters, advertisements on vehicles such as trains, or displays on a variety of cards such as credit cards. An example of such an electronic device is illustrated in FIG. 22. FIG. 22 illustrates an example of an e-book reader.

As illustrated in FIG. 22, an e-book reader 2700 has two housings 2701 and 2703. The housings 2701 and 2703 are bound with each other by an axis portion 2711, along which the e-book reader 2700 is opened and closed. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 22) can display a text image and a display portion on the left side (the display portion 2707 in FIG. 22) can display a different type of image.

FIG. 22 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. In addition, an external connection terminal (an earphone terminal, a USB terminal, a terminal connectable to a variety of cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a structure capable of wirelessly transmitting and receiving data. Through wireless communication, desired book data or the like can be purchased and downloaded from an e-book server.

Note that this embodiment can be combined with or replaced by any of the other embodiments as appropriate.

Embodiment 10

In this embodiment, a system-on-panel display device will be described as one embodiment of the display device in Embodiment 6.

The shift register which is one embodiment of the present invention can be applied to a system-on-panel display device in which a display portion and a driver circuit are provided over one substrate. A specific structure of the display device will be described below.

The display device in this embodiment includes a display element. As the display element, a liquid crystal element (also referred to as a liquid crystal display element) or a light-emitting element (also referred to as a light-emitting display element) can be used. The light-emitting element includes an element whose luminance is controlled by current or voltage in its category, and specifically includes an inorganic electroluminescent (EL) element, an organic EL element, and the like. Furthermore, a display medium whose contrast is changed by an electric effect, such as electronic ink, can be used.

In addition, the display device in this embodiment includes a panel in which a display element is sealed, and a module in which an IC and the like including a controller are mounted on the panel. Moreover, regarding one embodiment of an element substrate before the display element is completed in a process for manufacturing the display device, the element substrate is provided with a unit for supplying current to the display element in each of a plurality of pixels. Specifically, the element substrate may be in a state after only a pixel electrode of the display element is formed, a state after a conductive film to serve as a pixel electrode is formed and before the conductive film is etched to form the pixel electrode, or any of other states.

Note that a display device in this specification means an image display device, a display device, or a light source (including a lighting device). Further, the display device also includes a module provided with a connector. For example, the display device includes the following modules in its category: a module to which a flexible printed circuit (FPC), a tape automated bonding (TAB) tape, or a tape carrier package (TCP) is attached; a module having a TAB tape or a TCP at the end of which is provided with a printed wiring board; and a module having an integrated circuit (IC) that is directly mounted on a display element by a chip on glass (COG) method.

Next, the appearance and cross section of a liquid crystal display panel which is one embodiment of the display device in this embodiment will be described with reference to FIGS. 23A1 to 23B.

Each of FIGS. 23A1 and 23A2 is a top view of the display device in this embodiment, in which a liquid crystal element 4013 and TFTs 4010 and 4011 which are formed over a first substrate 4001 are sealed between the first substrate 4001 and a second substrate 4006 with a sealant 4005. The TFTs 4010 and 4011 includes the In—Ga—Zn—O-based film shown in Embodiment 4 as a semiconductor layer. FIG. 23B is a cross-sectional view taken along line M-N in FIGS. 23A1 and 23A2.

In the display device in this embodiment, the sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 are sealed together with a liquid crystal layer 4008, by the first substrate 4001, the sealant 4005, and the second substrate 4006. Further, a signal line driver circuit 4003 which is formed using a single crystal semiconductor film or a polycrystalline semiconductor film over a substrate prepared separately is mounted in a region that is different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 23A1 illustrates an example of mounting the signal line driver circuit 4003 by a COG method, and FIG. 23A2 illustrates an example of mounting the signal line driver circuit 4003 by a TAB method.

The pixel portion 4002 and the scan line driver circuit 4004, which are provided over the first substrate 4001, each include a plurality of TFTs. FIG. 23B illustrates the TFT 4010 included in the pixel portion 4002 and the TFT 4011 included in the scan line driver circuit 4004. Insulating layers 4020, 4021, and 4042 are provided over the TFTs 4010 and 4011.

As the TFTs 4010 and 4011, a TFT including an oxide semiconductor layer as a semiconductor layer can be used. In this embodiment, the TFTs 4010 and 4011 are n-channel TFTs.

A pixel electrode 4030 included in the liquid crystal element 4013 is electrically connected to the TFT 4010. A counter electrode 4031 of the liquid crystal element 4013 is formed on the second substrate 4006. The liquid crystal element 4013 corresponds to a region where the pixel electrode 4030, the counter electrode 4031, and the liquid crystal layer 4008 overlap with each other. The pixel electrode 4030 and the counter electrode 4031 are provided with insulating layers 4032 and 4033 functioning as alignment films, respectively. The liquid crystal layer 4008 is sandwiched between the pixel electrode 4030 and the counter electrode 4031 with the insulating layers 4032 and 4033 therebetween.

A material and a manufacturing method which can be used for the substrate 201 in the above embodiments can be applied to the first substrate 4001 and the second substrate 4006.

A spacer 4035 is a columnar partition obtained by selective etching of an insulating film, and is provided in order to control a distance (a cell gap) between the pixel electrode 4030 and the counter electrode 4031. Note that a spherical spacer may be used. Further, the counter electrode 4031 is electrically connected to a common potential line provided over the same substrate as the TFT 4010. With the use of a common connection portion, the counter electrode 4031 and the common potential line can be electrically connected to each other through conductive particles arranged between the pair of substrates. Note that the conductive particles are included in the sealant 4005.

Note that although this embodiment shows an example of a transmissive liquid crystal display device, the present invention can also be applied to a reflective liquid crystal display device or a semi-transmissive liquid crystal display device.

As the liquid crystal display device in this embodiment, an example is shown in which a polarizing plate is provided on the outer side of the substrate (on the viewer side) and a coloring layer and the electrode used for the display element are sequentially provided on the inner side; alternatively, a polarizing plate may be provided on the inner side of the substrate. The stacked structure of the polarizing plate and the coloring layer is not limited to this embodiment and may be set as appropriate depending on materials of the polarizing plate and the coloring layer or conditions of manufacturing process. Further, a light-blocking film serving as a black matrix may be provided.

In this embodiment, in order to reduce surface unevenness of the TFT and improve reliability of the TFT, the TFT is covered with insulating layers (the insulating layers 4020, 4021, and 4042) functioning as a protective layer or a planarization insulating film. Note that the protective layer prevents penetration of contaminating impurities such as an organic substance, metal, or water vapor included in the air, and is preferably a dense film. The protective layer may be formed by a sputtering method to be a single layer or a stacked layer of a silicon oxide film, a silicon nitride film, a silicon oxynitride film, a silicon nitride oxide film, an aluminum oxide film, an aluminum nitride film, an aluminum oxynitride film, and/or an aluminum nitride oxide film. Although this embodiment shows an example of forming the protective layer by a sputtering method, there is no limitation thereto and variety of methods may be employed. Further, with the use of a non-reducible film, the protective layer can also function as a reduction prevention layer.

Here, an insulating layer having a stacked structure is formed as the protective layer. A silicon oxide film is formed as the insulating layer 4042 by a sputtering method, which is a first layer of the protective layer. The use of the silicon oxide film as the protective layer is effective in preventing hillocks in an aluminum film used for a source electrode and a drain electrode.

A silicon nitride film is formed as the insulating layer 4020 by a sputtering method, which is a second layer of the protective layer. The use of the silicon nitride film as the protective layer can prevent mobile ions such as sodium from entering the semiconductor region and changing electric characteristics of the TFT.

Further, the semiconductor layer may be subjected to a heat treatment after formation of the protective layer.

The insulating layer 4021 is formed as the planarizing insulating film. An organic material having heat resistance, such as polyimide, acrylic, polyimideamide, benzocyclobutene, polyamide, or epoxy can be used for the insulating layer 4021. Other than such organic materials, a low-dielectric constant material (a low-k material), a siloxane-based resin, phosphosilicate glass (PSG), borophosphosilicate glass (BPSG), or the like can also be used. Note that the insulating layer 4021 may be formed by stacking a plurality of insulating films formed of these materials.

Note that the siloxane resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the formation method of the insulating layer 4021. Depending on the material, the insulating layer 4021 can be formed by a method such as a sputtering method, an SOG method, a spin coating method, a dipping method, a spray coating method, or a droplet discharge method (e.g., an ink-jet method, screen printing, or offset printing), or with a tool (apparatus) such as a doctor knife, a roll coater, a curtain coater, a knife coater, or the like. When the insulating layer 4021 is formed using material liquid, annealing of the semiconductor layer may be performed in a baking step at the same time. The step of baking the insulating layer 4021 serves to anneal the semiconductor layer, whereby the display device can be efficiently manufactured.

The pixel electrode 4030 and the counter electrode 4031 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, indium tin oxide to which silicon oxide is added, or the like.

The pixel electrode 4030 and the counter electrode 4031 can also be formed using a conductive composition including a conductive high molecule (also referred to as a conductive polymer). The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called t-electron conjugated conductive polymer can be used. Examples thereof are polyaniline or a derivative thereof, polypyrrole or a derivative thereof, polythiophene or a derivative thereof, and a copolymer of two or more kinds of these materials.

Further, a variety of signals and potentials are supplied from an FPC 4018 to the signal line driver circuit 4003 which is separately formed, the scan line driver circuit 4004, or the pixel portion 4002.

In this embodiment, a connection terminal electrode 4015 is formed using the same conductive film as the pixel electrode 4030 included in the liquid crystal element 4013, and a terminal electrode 4016 is formed using the same conductive film as the source electrodes and the drain electrodes of the TFTs 4010 and 4011.

The connection terminal electrode 4015 is electrically connected to a terminal included in the FPC 4018 via an anisotropic conductive film 4019.

Although FIGS. 23A1 to 23B illustrate an example in which the signal line driver circuit 4003 is formed separately and mounted on the first substrate 4001, this embodiment is not limited to this structure. The scan line driver circuit may be separately formed and then mounted, or only part of the signal line driver circuit or part of the scan line driver circuit may be separately formed and then mounted.

As described above, a system-on-panel display device can be manufactured. For the display device in this embodiment, the shift register in the above embodiments can be used in the driver circuit, for example, and the shift register can be formed in the same process as the TFT in the display portion.

Note that this embodiment can be combined with or replaced by any of the other embodiments as appropriate.

Embodiment 11

The display devices described in Embodiments 6 to 10 can be applied to a variety of electronic devices (including amusement machines). Examples of electronic devices are a television device (also referred to as a television or a television receiver), a monitor of a computer or the like, a camera such as a digital camera or a digital video camera, a digital photo frame, a mobile phone (also referred to as a mobile telephone or a mobile phone device), a portable game machine, a portable information terminal, an audio reproducing device, a large-sized game machine such as a pachinko machine, and the like.

Figure 24A:
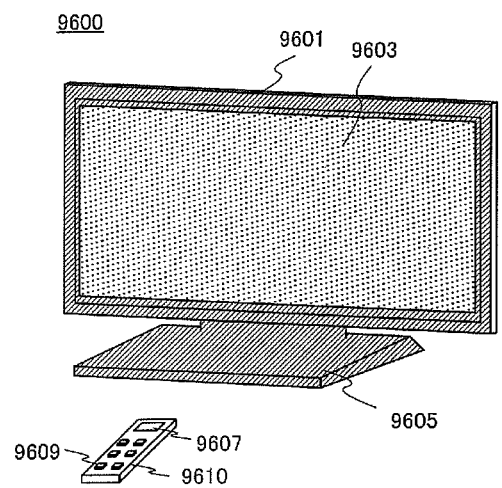
FIGS. 24A and 24B each illustrate an electronic device in Embodiment 11.

FIG. 24A illustrates an example of a television device. In a television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television device 9600 is provided with a receiver, a modem, and the like. With the use of the receiver, general television broadcasting can be received. Furthermore, when the television device 9600 is connected to a communication network by wired or wireless connection via the modem, one-way (from a transmitter to a receiver) or two-way (between a transmitter and a receiver, between receivers, or the like) data communication can be performed.

Figure 24B:
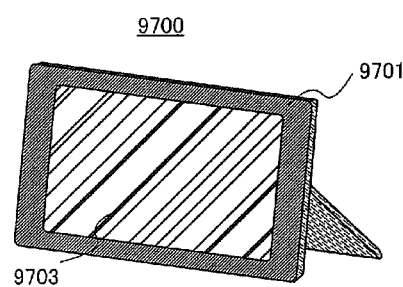

FIG. 24B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal connectable to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 25A:
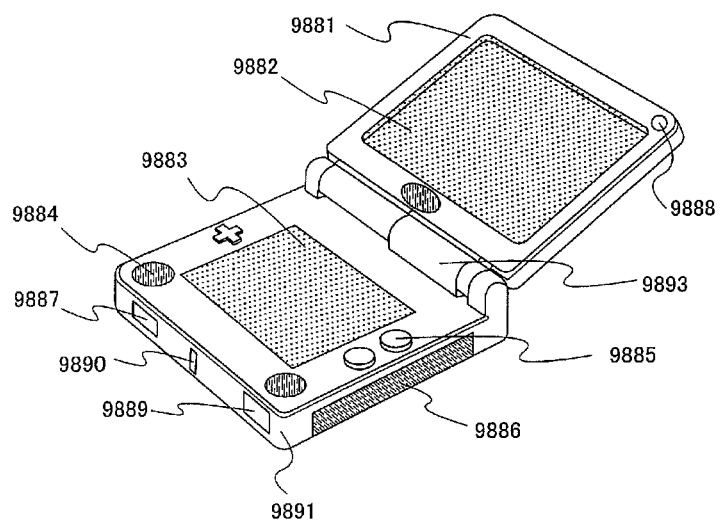
FIGS. 25A and 25B each illustrate an electronic device in Embodiment 11.

FIG. 25A illustrates a portable game machine including a housing 9881 and a housing 9891 which are jointed with a connector 9893 so as to be able to open and close. A display portion 9882 and a display portion 9883 are incorporated in the housing 9881 and the housing 9891, respectively. The portable game machine illustrated in FIG. 25A additionally includes a speaker portion 9884, a recording medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), a microphone 9889), and the like. It is needless to say that the structure of the portable game machine is not limited to that described above. The portable game machine may have a structure in which additional accessory equipment is provided as appropriate as long as at least a display device is provided. The portable game machine illustrated in FIG. 25A has a function of reading a program or data stored in a recording medium to display it on the display portion, and a function of sharing information with another portable game machine by wireless communication. The portable game machine illustrated in FIG. 25A can have various functions without limitation to the above.

Figure 25B:
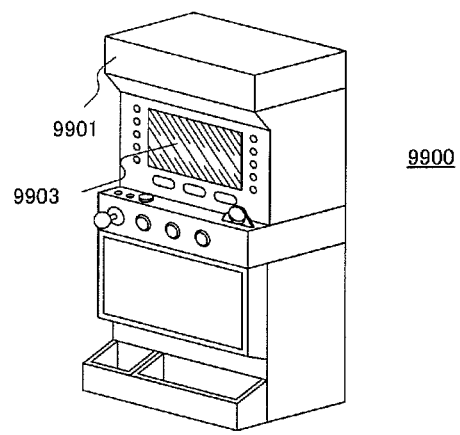

FIG. 25B illustrates an example of a slot machine, which is a large-sized game machine. In a slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above structure. The slot machine may have a structure in which additional accessory equipment is provided as appropriate as long as at least the display device according to the present invention is provided.

Figure 26A:
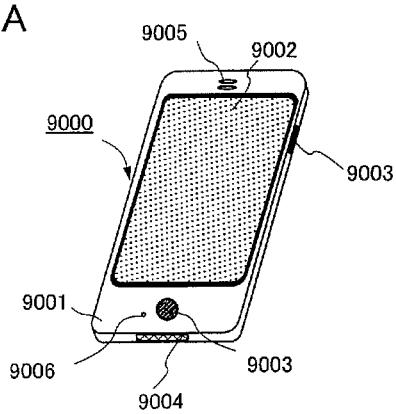
FIGS. 26A and 26B each illustrate an electronic device in Embodiment 11.

FIG. 26A illustrates an example of a mobile phone. A mobile phone 9000 is provided with a display portion 9002 incorporated into a housing 9001, an operation button 9003, an external connection port 9004, a speaker 9005, a microphone 9006, and the like.

When the display portion 9002 of the mobile phone 9000 illustrated in FIG. 26A is touched with a finger or the like, data can be input into the mobile phone 9000. Users can make a call or text messaging by touching the display portion 9002 with their fingers or the like.

There are mainly three screen modes of the display portion 9002. The first mode is a display mode mainly for displaying an image. The second mode is an input mode mainly for inputting data such as text. The third mode is a display-and-input mode in which two modes of the display mode and the input mode are combined.

For example, in the case of making a call or texting, a text input mode mainly for inputting text is selected for the display portion 9002 so that characters displayed on a screen can be input. In that case, it is preferable to display a keyboard or number buttons on almost all area of the screen of the display portion 9002.

When a detection device including a sensor for detecting inclination, such as a gyroscope or an acceleration sensor, is provided inside the mobile phone 9000, display on the screen of the display portion 9002 can be automatically changed by determining the orientation of the mobile phone 9000 (whether the mobile phone 9000 stands upright or is laid down on its side).

The screen modes are changed by touching the display portion 9002 or using the operation buttons 9003 of the housing 9001. Alternatively, the screen modes may be changed depending on the kind of the image displayed on the display portion 9002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 9002 is not performed for a certain period while a signal detected by an optical sensor in the display portion 9002 is detected, the screen mode may be controlled so as to be changed from the input mode to the display mode.

The display portion 9002 can also function as an image sensor. For example, an image of a palm print, a fingerprint, or the like is taken when the display portion 9002 is touched with a palm or a finger, whereby personal identification can be performed. Further, by providing a backlight or a sensing light source which emits a near-infrared light in the display portion, an image of a finger vein, a palm vein, or the like can be taken.

Figure 26B:
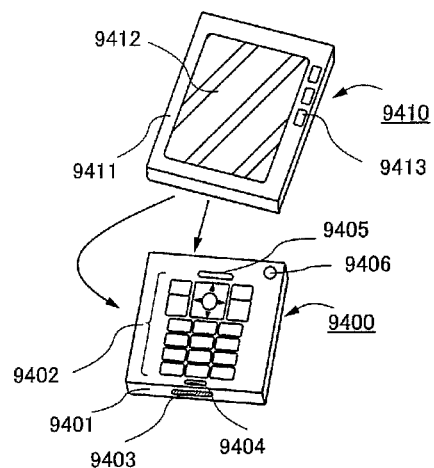

FIG. 26B illustrates another example of a mobile phone. The mobile phone in FIG. 26B includes a display device 9410 in which a display portion 9412 and operation buttons 9413 are included in a housing 9411; and a communication device 9400 in which operation buttons 9402, an external input terminal 9403, a microphone 9404, a speaker 9405, and a light-emitting portion 9406 that emits light when receiving a call are included in a housing 9401. The display device 9410 having a display function can be detached from and attached to the communication device 9400 having a telephone function in two directions indicated by arrows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

This embodiment can be implemented in appropriate combination with the structures described in the other embodiments.

Example 1

In this example, a light-emitting display device in which a scan line driver circuit and a signal line driver circuit are formed over one substrate will be described. Note that as an example, in the light-emitting display device of this example, the signal line driver circuit has the structure illustrated in FIG. 12A, a shift register included in the signal line driver circuit has the structure illustrated in FIG. 13C, and a pixel has a circuit structure illustrated in FIG. 18.

Figure 27:
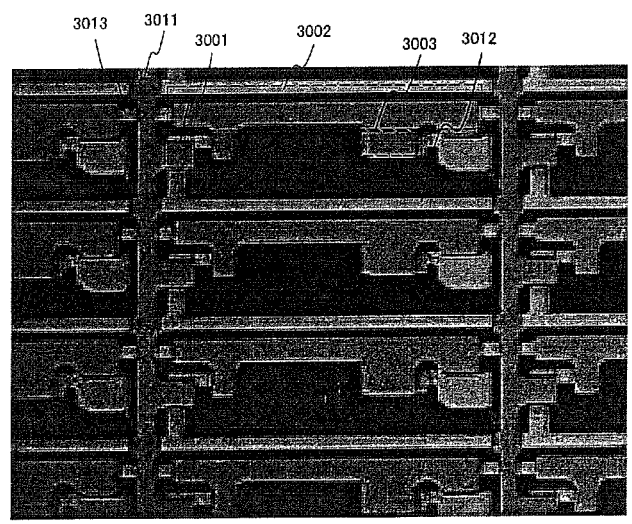
FIG. 27 illustrates a layout of a pixel portion in a light-emitting display device in Example 1.

A layout of a pixel portion in the light-emitting display device of this example will be described with reference to FIG. 27. FIG. 27 illustrates a layout of the pixel portion of the light-emitting display device of this example.

The pixel portion of the light-emitting display device in FIG. 27 includes a plurality of pixels. Each pixel includes a transistor 3001, a capacitor 3002, a transistor 3003, a scan line 3011, a signal line 3012, and a power supply line 3013. The transistor 3001 corresponds to the transistor 851 in FIG. 18. The capacitor 3002 corresponds to the capacitor 852 in FIG. 18. The transistor 3003 corresponds to the transistor 853 in FIG. 18. The scan line 3011 corresponds to the scan line 855 in FIG. 18. The signal line 3012 corresponds to the signal line 856 in FIG. 18. The transistors 3001 and 3003 each include an In—Ga—Zn—O-based oxide semiconductor layer as a channel formation layer. As for the pixels of the light-emitting display device of this example, the number of pixels is 540×960×3, a pixel pitch is 0.026 mm×0.078 mm×3, resolution is 326 ppi, and an aperture ratio is 40%.

The pixel in the light-emitting display device in FIG. 27 has a bottom-emission structure and color filters of R (red), G (green), and B (blue) are provided on a substrate (element substrate) side over which an element such as a transistor is formed (such a structure is referred to as a color filter on array structure). The light-emitting element is a white organic EL element.

Figure 28:
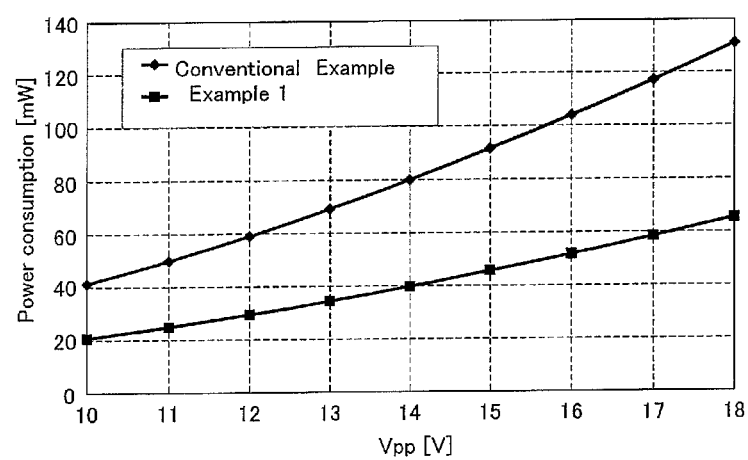
FIG. 28 is a graph showing measurement results of power consumption of a light-emitting display device in Example 1.

Power consumption of the light-emitting display device of this example was measured. FIG. 28 shows the measurement result. FIG. 28 shows a relationship between power supply voltage of the light-emitting display device of this example and power consumption of the display device. The horizontal axis indicates power supply voltage Vpp and the vertical axis indicates power consumption. FIG. 28 shows power consumption of a conventional light-emitting display device in which a four-phase clock signal is used in addition to the measurement result of the power consumption of the light-emitting display device of this embodiment, in which an eight-phase clock signal is used.

As shown in FIG. 28, the light-emitting display device of this example consumes less power than the conventional light-emitting display device. The gap between the power consumptions widened as the power supply voltage becomes higher.

Thus, it is found that power consumption can be reduced in such a manner that the number of clock signals is increased and the number of flip-flops which operate in accordance with each clock signal is reduced.

This application is based on Japanese Patent Application serial no. 2009-235109 filed with Japan Patent Office on Oct. 9, 2009, and Japanese Patent Application serial no. 2009-273914 filed with Japan Paten Office on Dec. 1, 2009, the entire contents of which are hereby incorporated by reference.

The invention claimed is:

1. A shift register comprising:
a first flip-flop to which a first clock signal which is in a first voltage state in a first period and in a second voltage state in second to fourth periods is input;
a second flip-flop to which a second clock signal which is in the first voltage state in at least part of the second period and in the second voltage state in at least part of the third period, and the fourth period is input;
a third flip-flop to which a third clock signal which is in the second voltage state in the first, second, and fourth periods and in the first voltage state in the third period is input;
a fourth flip-flop to which a fourth clock signal which is in the second voltage state in at least part of the first period, and the second period and in the first voltage state in at least part of the fourth period is input;
a first to fourth clock signal lines;
a first power supply line to which a high power supply voltage is applied; and
a second power supply line to which a low power supply voltage is applied,
wherein each of the first to fourth flip-flops comprises:
a first transistor comprising a gate, a source and a drain,
wherein a start signal is input to the gate of the first transistor, and
wherein one of the source and the drain of the first transistor is electrically connected to the first power supply line;
a second transistor comprising a gate, a source and a drain,
wherein the gate of the second transistor is electrically connected to the other of the source and the drain of the first transistor,
wherein one of the source and the drain of the second transistor is electrically connected to one of the first to fourth clock signal lines, and
wherein an output signal is output from the other of the source and the drain of the second transistor;
a third transistor comprising a gate, a source and a drain,
wherein one of the source and the drain of the third transistor is electrically connected to the gate of the second transistor, and wherein the other of the source and the drain of the third transistor is electrically connected to the second power supply line; and a fourth transistor comprising a gate, a source and a drain, wherein the gate of the fourth transistor is directly connected to the gate of the third transistor.

2. The shift register according to claim 1, wherein the first to third transistors have a same conductivity type.

3. The shift register according to claim 1, wherein each of the first to third transistors comprises an oxide semiconductor layer serving as a channel formation layer.

4. A display device comprising:
a driver circuit comprising the shift register according to claim 1; and
a pixel portion comprising a pixel whose display state is controlled by the driver circuit.

5. A method for driving a shift register comprising a first to fourth flip-flops; a first to fourth clock signal lines; a first power supply line to which a high power supply voltage is applied; and a second power supply line to which a low power supply voltage is applied, the method comprising:
inputting a first clock signal, which is in a first voltage state in a first period and in a second voltage state in second to fourth periods, to the first flip-flop;
inputting a second clock signal, which is in the first voltage state in at least part of the second period and in the second voltage state in at least part of the third period, and the fourth period, to the second flip-flop;
inputting a third clock signal, which is in the second voltage state in the first, second, and fourth periods and in the first voltage state in the third period, to the third flip-flop; and
inputting a fourth clock signal, which is in the second voltage state in at least part of the first period, and the second period and in the first voltage state in at least part of the fourth period, to the fourth flip-flop,
wherein each of the first to fourth flip-flops comprises:
a first transistor comprising a gate, a source and a drain,
wherein a start signal is input to the gate of the first transistor, and
wherein one of the source and the drain of the first transistor is electrically connected to the first power supply line;
a second transistor comprising a gate, a source and a drain,
wherein the gate of the second transistor is electrically connected to the other of the source and the drain of the first transistor,
wherein one of the source and the drain of the second transistor is electrically connected to one of the first to fourth clock signal lines, and
wherein an output signal is output from the other of the source and the drain of the second transistor;
a third transistor comprising a gate, a source and a drain,
wherein one of the source and the drain of the third transistor is electrically connected to the gate of the second transistor, and
wherein the other of the source and the drain of the third transistor is electrically connected to the second power supply line; and
a fourth transistor comprising a gate, a source and a drain,
wherein the gate of the fourth transistor is directly connected to the gate of the third transistor.

6. The shift register according to claim 5, wherein the first to third transistors have a same conductivity type.

7. The shift register according to claim 5, wherein each of the first to third transistors comprises an oxide semiconductor layer serving as a channel formation layer.

8. A display device comprising:
a driver circuit comprising the shift register according to claim 5; and
a pixel portion comprising a pixel whose display state is controlled by the driver circuit.

9. A shift register comprising:
a first flip-flop to which a first clock signal which is in a first voltage state in a first period and in a second voltage state in second to fourth periods is input;
a second flip-flop to which a second clock signal which is in the first voltage state in at least part of the second period and in the second voltage state in at least part of the third period, and the fourth period is input;
a third flip-flop to which a third clock signal which is in the second voltage state in the first, second, and fourth periods and in the first voltage state in the third period is input;
a fourth flip-flop to which a fourth clock signal which is in the second voltage state in at least part of the first period, and the second period and in the first voltage state in at least part of the fourth period is input;
a first to fourth clock signal lines;
a first power supply line to which a high power supply voltage is applied; and
a second power supply line to which a low power supply voltage is applied,
wherein each of the first to fourth flip-flops comprises:
a first transistor comprising a gate, a source and a drain,
wherein a start signal is input to the gate of the first transistor, and
wherein one of the source and the drain of the first transistor is electrically connected to the first power supply line;
a second transistor comprising a gate, a source and a drain,
wherein the gate of the second transistor is electrically connected to the other of the source and the drain of the first transistor,
wherein one of the source and the drain of the second transistor is electrically connected to one of the first to fourth clock signal lines, and
wherein an output signal is output from the other of the source and the drain of the second transistor;
a third transistor comprising a gate, a source and a drain,
wherein one of the source and the drain of the third transistor is electrically connected to the gate of the second transistor, and
wherein the other of the source and the drain of the third transistor is electrically connected to the second power supply line; and
a fourth transistor comprising a gate, a source and a drain,
wherein the gate of the fourth transistor is directly connected to the gate of the third transistor,
wherein one of the source and the drain of the fourth transistor is electrically connected to the other of the source and the drain of the second transistor, and
wherein the other of the source and the drain of the fourth sixth transistor is electrically connected to the second power supply line.

10. The shift register according to claim 9, wherein the first to fourth sixth transistors have a same conductivity type.

11. The shift register according to claim 9, wherein each of the first to fourth sixth transistors comprises an oxide semiconductor layer serving as a channel formation layer.

12. A display device comprising:
- a driver circuit comprising the shift register according to claim 9; and
- a pixel portion comprising a pixel whose display state is controlled by the driver circuit.

* * * * *

UNITED STATES PATENT AND TRADEMARK OFFICE
CERTIFICATE OF CORRECTION

PATENT NO. : 9,171,640 B2
APPLICATION NO. : 12/897375
DATED : October 27, 2015
INVENTOR(S) : Hiroyuki Miyake and Seiko Amano It is certified that error appears in the above-identified patent and that said Letters Patent is hereby corrected as shown below:

Specification

Column 11, line 26, replace "2156" with --215b--;

Column 13, line 66, after "layer" replace "21426" with --2142b--;

Column 14, line 50, after "and" replace "B203" with --$B_2O_3$--;

Column 18, line 53, after "an" replace "ink jet" with --ink-jet--;

Column 19, line 11, replace "2156)" with --215b)--;

Column 24, line 23, replace "56041 to 5604$k$" with --5604_1 to 5604_$k$--;

Column 39, line 62, after "region" replace "5906" with --590b--;

Column 44, line 27, after "so-called" replace "t-electron" with --π-electron--;

Claims

Column 50, line 64, in claim 9, after "fourth" delete "sixth";

Column 50, line 67, in claim 10, after "fourth" delete "sixth"; and

Column 51, line 2, in claim 11, after "fourth" delete "sixth".

Signed and Sealed this
Twenty-ninth Day of March, 2016

Michelle K. Lee
*Director of the United States Patent and Trademark Office*